United States Patent [19]
Kaizu et al.

[11] Patent Number: 5,517,224
[45] Date of Patent: May 14, 1996

[54] SEMICONDUCTOR DEVICE FOR DRIVING HEAT GENERATOR

[75] Inventors: Shunichi Kaizu; Hiroyuki Nakamura, both of Atsugi; Toshihiko Ichise, Kawasaki; Kei Fujita, Sagamihara; Seiji Kamei, Hiratsuka, all of Japan

[73] Assignee: Canon Kabushiki Kaisha, Tokyo, Japan

[21] Appl. No.: 77,382

[22] Filed: Jun. 17, 1993

[30] Foreign Application Priority Data

Jun. 18, 1992 [JP] Japan .................................. 4-159748
Jun. 1, 1993 [JP] Japan .................................. 5-130289

[51] Int. Cl.$^6$ .................................................. B41J 2/05
[52] U.S. Cl. .......................... 347/59; 257/336; 347/209
[58] Field of Search ............................ 347/59, 58, 57, 347/209, 210; 257/336

[56] References Cited

U.S. PATENT DOCUMENTS

| | | | |
|---|---|---|---|
| 4,429,321 | 1/1984 | Matsumoto | 347/59 |
| 4,614,407 | 9/1986 | Hotta | 350/339 R |
| 5,055,859 | 10/1991 | Wakabayashi | 346/76 PH |
| 5,081,474 | 1/1992 | Shibata et al. | 347/59 |
| 5,157,419 | 10/1992 | Matsumoto | 347/59 |
| 5,192,990 | 3/1993 | Stevens | 257/336 |
| 5,200,639 | 4/1993 | Ishizuka et al. | 257/508 |
| 5,212,503 | 5/1993 | Saito et al. | 347/59 |
| 5,216,447 | 6/1993 | Fujita et al. | 347/59 |

FOREIGN PATENT DOCUMENTS

| | | | |
|---|---|---|---|
| 378439 | 7/1990 | European Pat. Off. | B41J 2/05 |
| 378439A3 | 7/1990 | European Pat. Off. | B41J 2/05 |
| 0440459 | 7/1991 | European Pat. Off. | B41J 2/05 |
| 440459 | 8/1991 | European Pat. Off. | B41J 2/05 |
| 469370A2 | 2/1992 | European Pat. Off. | H01L 21/033 |

OTHER PUBLICATIONS

M. Hoshi et al., "Low On–Resistance Power LDMESFET Using Double Metal Process Technology" Third International Symposium on Power Semiconductor Devices and ICS'; 22 Apr. 1991, USA, pp. 61–64.
Patent Abstracts of Japan, vol. 012, No. 489 Dec. 1988 and JP–A–63 202 971 (Toshiba).

*Primary Examiner*—Joseph W. Hartary
*Attorney, Agent, or Firm*—Fitzpatrick, Cella, Harper & Scinto

[57] ABSTRACT

A semiconductor device has transistors, each transistor having a first conduction type of a first semiconductor region including a first main electrode region, a second conduction type of second semiconductor region including a channel region which is provided in the first semiconductor region, a second main electrode region provided in the second semiconductor region, a gate electrode on the channel region extending through a gate insulating film between the first and second main electrode regions. A portion of the first main electrode region which contacts the channel region is a high-resistance region. The semiconductor device also has buried-type element isolation regions which prevent the occurrence of latch up and bird's beaks in the device.

23 Claims, 22 Drawing Sheets

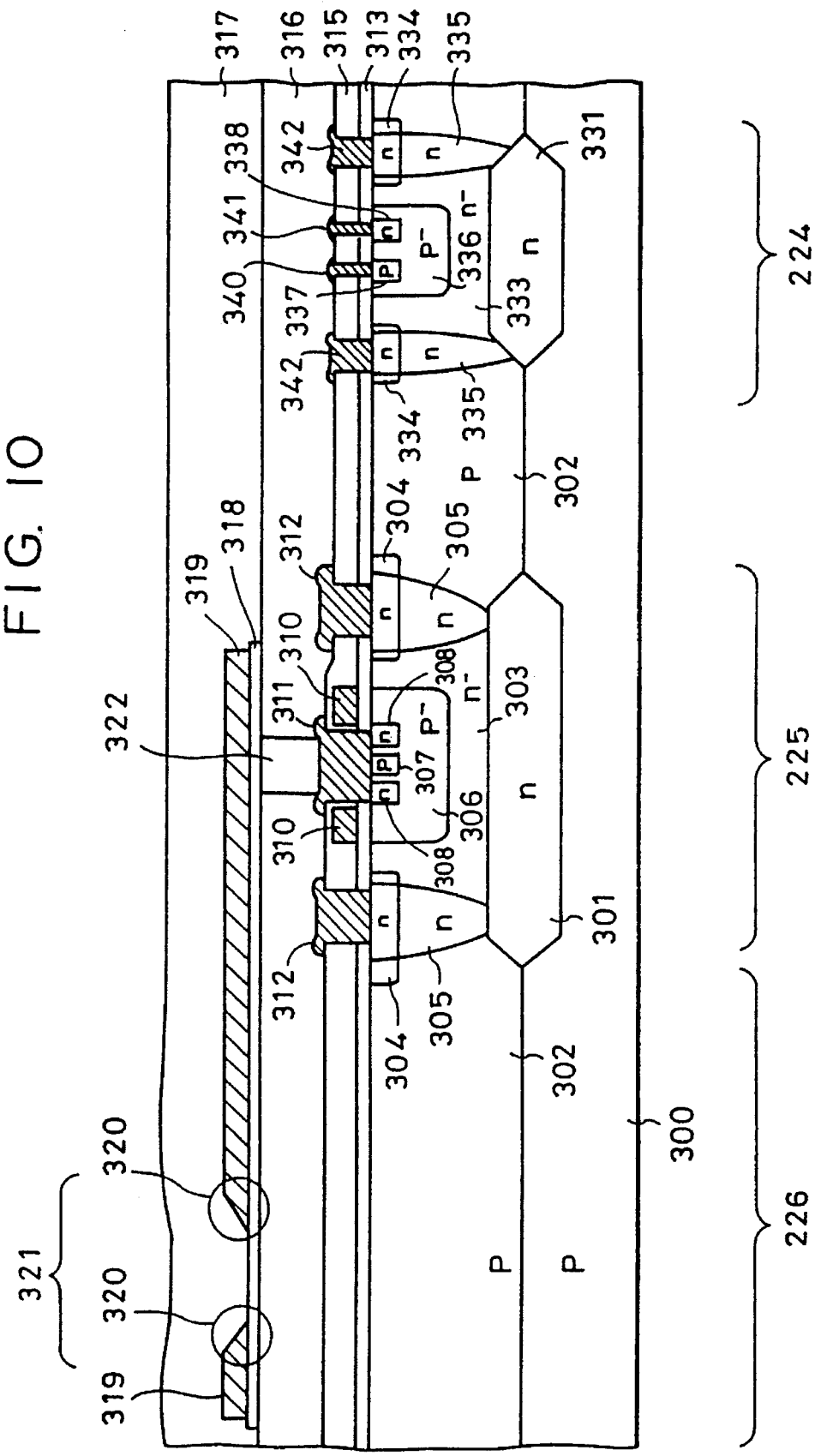

PRIOR ART

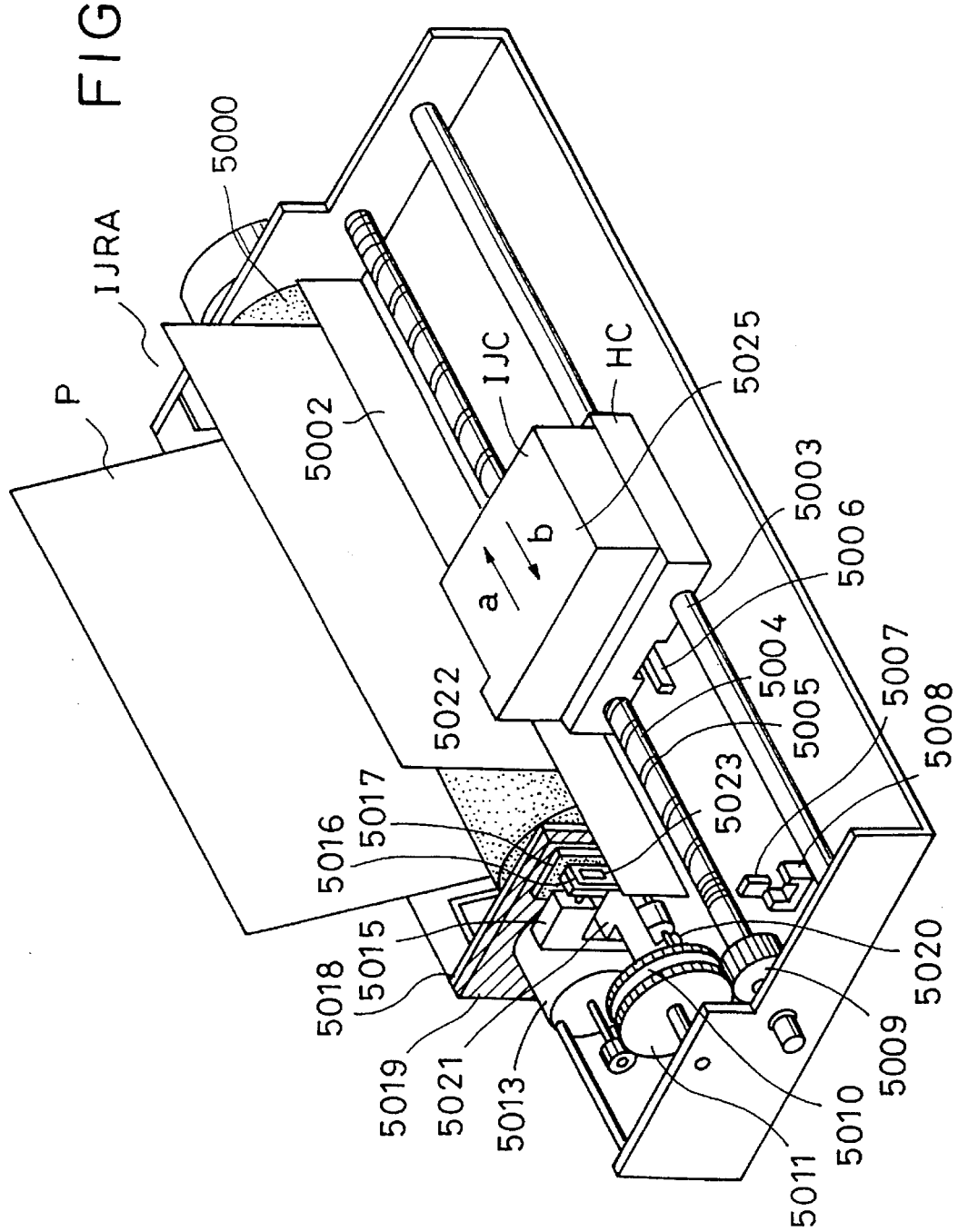

SEMICONDUCTOR DEVICE FOR DRIVING HEAT GENERATOR

BACKGROUND OF THE INVENTION

1. Field of the Invention

The present invention relates to a semiconductor device for driving a heat generator used in an ink jet head or a thermal head which is mounted on a printer such as a copying machine, facsimile equipment or the like.

2. Description of the Related Art

A thermal head is provided with a heat generator comprising either a thin film resistor or a thick film resistor.

Alternatively, there are ink jet heads which are capable of reproducing excellent images which include a head which discharges ink by using thermal energy. This head is also provided with a heat generator comprising a thin film resistor or the like.

A semiconductor device is used for driving such a heat generator. Known examples of such semiconductor devices include the devices disclosed in U.S. Pat. No. 4,429,321, and European Patent Laid-Open Nos. 0,378,439 and 0,440,459.

For example, the circuit shown in FIG. 1 is generally known as a matrix circuit for driving a 64-bit ink jet head. The matrix circuit shown in FIG. 1 has a switching circuit comprising 64 diodes 11, 12, ... 18, ... 81, 82, ... 88 which are divided into 8 blocks for common lines and 8 blocks for segment lines. The blocks for the common lines are respectively provided with 8 switches Com1, Com2 ... Com8, and the blocks for the segment lines are respectively provided with 8 0 switches Seg1, Seg2 ... Seg8. Such a matrix circuit is generally provided on a silicon substrate SUB by a bipolar process.

However, if such a matrix circuit comprises pn-type diode switches disposed on a silicon substrate, error is produced between respective common switches or segment switches. It is thus necessary that diodes each comprise an npn transistor and are arranged on a substrate by collector-base short circuiting. Such a matrix circuit also has the following problems to be solved:

(1) The process is complicated due to using bipolar process;

(2) Since a large current (200 mA) flows through each diode switch, and a current of about 1.6 mA flows through the external switches of each block for the common lines when the 8 external switches for the segment lines are simultaneously turned on, the arrangement of the external switches is complicated.

In order to solve the above two problems, a matrix circuit has been proposed in which an npn transistor switching circuit is used in place of the diode switching circuit shown in FIG. 1, as shown in FIG. 2. However, this matrix circuit has the limitation noted below. The limitation is described below with reference to FIG. 3 which shows an equivalent circuit for one bit of the matrix circuit shown in FIG. 2.

In FIG. 3, assuming that current I is 200 mA, and the forward current amplification factor of a transistor Tr11 is 100, the following equations are established:

$$I = I_C + I_B$$

$$I_C = \beta I_B$$

The potential at point (A) shown in FIG. 3 is $V^+ - I_C \times r_{SC}$, and the potential at point (B) is $V^+ - I_B \times r_B$ under the condition in that a parasitic pnp transistor is not turned on. The ideal potential $V_{BE}$ of the parasitic pnp transistor preferably satisfies the following condition:

$$V_{BE} = I_C \times r_{SC} - I_B \times r_B \leq 0$$

The relation, $I_C \times r_{SC} < I_B \times r_B$, is thus required. In order to satisfy this relation it is necessary to decrease the voltage drop caused by the collector current $I_C$, which is characteristic of an npn transistor, and decrease both the collector series resistance $r_{SC}$ and the forward current amplification factor $\beta$ of the transistor Tr11, In the matrix circuit comprising the npn transistor switching circuit shown in FIG. 2, although the current flowing through a common external switch 1 (Com1) is decreased, as compared with the diode switching circuit shown in FIG. 1, the base current $I_B$ flowing through the common external switch 1 is increased to some extent due to the limitations on the characteristics of a transistor. Thus the matrix circuit shown in FIG. 2 still has the problem that the configuration of the external switching circuit for the common lines must be complicated.

The inventors thus determined that the npn transistor switches shown in FIGS. 2 and 3 be replaced by nMOS transistor switches. Since the external switching circuit for the common lines controls the nMOS transistor switches alone, the configuration of the external switching circuit for the common lines can be simplified. However, this Circuit has the problem that since the potential $V^+$ is 30 to 40 V, when a generally known nMOS transistor is used, the electric field strength between a source and a drain is increased, and hot carriers thus occur, thereby causing changes in the threshold value ($V_{th}$) and the transconductance of the nMOS transistor due to the entrance of the hot carriers into a gate oxide film. In addition, since the pn junction formed by an n-type drain and a p-type well is reversely biased, avalanche breakdown occurs.

SUMMARY OF THE INVENTION

Accordingly, an object Of the present invention is to provide a semiconductor device for driving a heat generator with high reliability.

Another object of the present invention is to provide a semiconductor device with excellent voltage resistance which permits a decrease in the electric field strength between a source and a drain.

Still another object of the present invention is to provide a semiconductor device having an element isolation structure in which an element isolation region is in a pnp sandwich structure for preventing latch up, and the pn junction formed by the element isolation region is short-circuited.

A further object of the present invention is to provide a semiconductor device having buried-type dielectric element isolation regions which can comply with an increase in integration so that the production yield can be increased.

A still further object of the present invention is to provide a method of producing a semiconductor device with excellent durability and high performance.

In order to achieve these objects, a semiconductor device of the present invention comprises transistors each having a first conduction type of first semiconductor region including a first main electrode region, a second conduction type of second semiconductor region provided in the first semiconductor region and including a channel region, a second main electrode region provided in the second semiconductor region, and a gate electrode provided on the channel region between the first and second main electrode regions through a gate insulating film, wherein a portion of the first main electrode region in contact with the channel region is a high-resistance region.

The present invention also provides a semiconductor device in which the element isolation structure and the shape of an electrode are appropriately improved so that the characteristics thereof are further improved.

BRIEF DESCRIPTION OF THE DRAWINGS

FIG. 10 is a schematic sectional view showing an example of a semiconductor device of the present invention;

FIG. 26 is a schematic drawing showing an ink jet printer to which the present invention is applied.

DETAILED DESCRIPTION OF THE PREFERRED EMBODIMENTS

Figure 1:
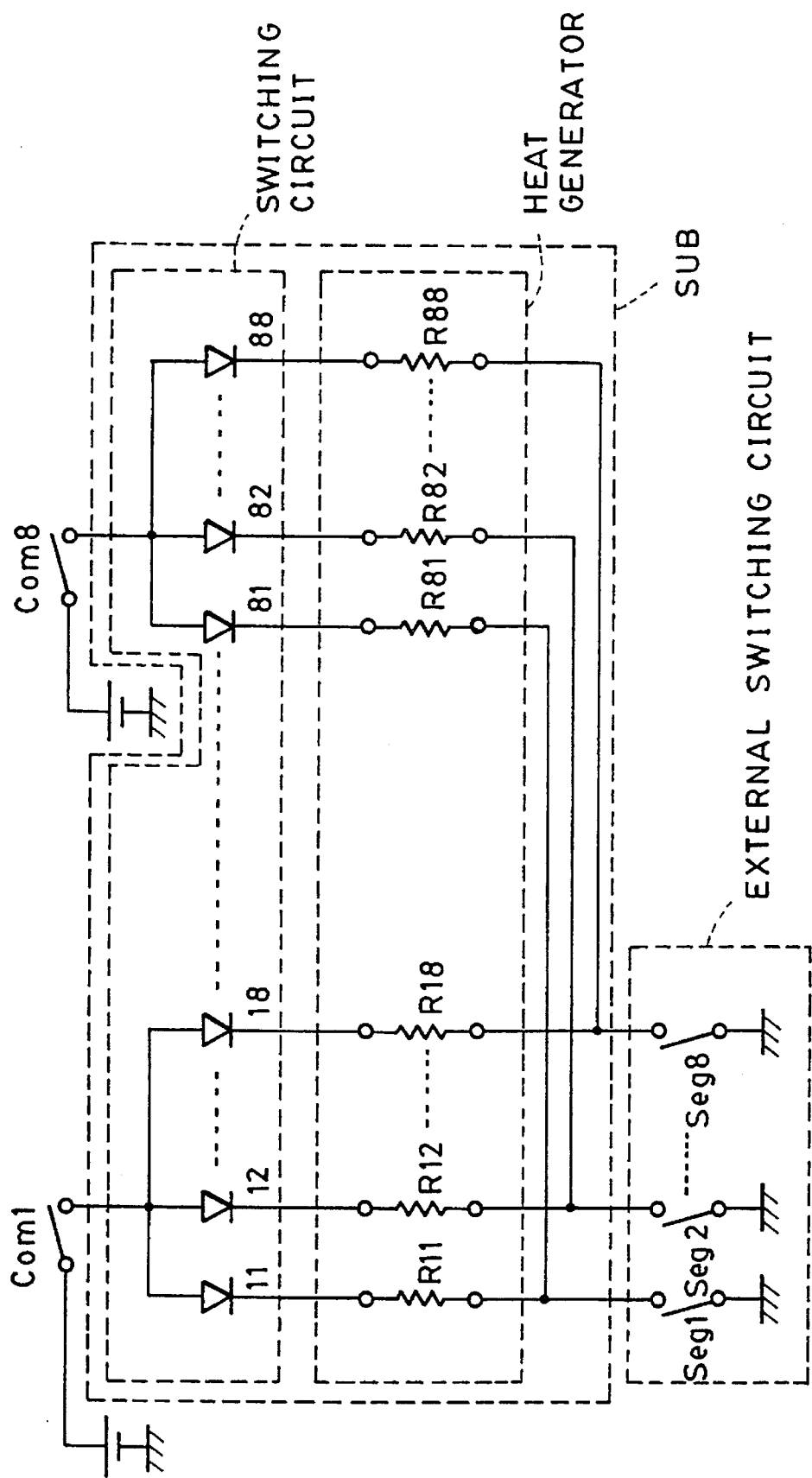
FIG. 1 is a drawing showing a matrix switching circuit of a conventional ink jet recording head using a plurality of diode switching circuits.
Figure 2:
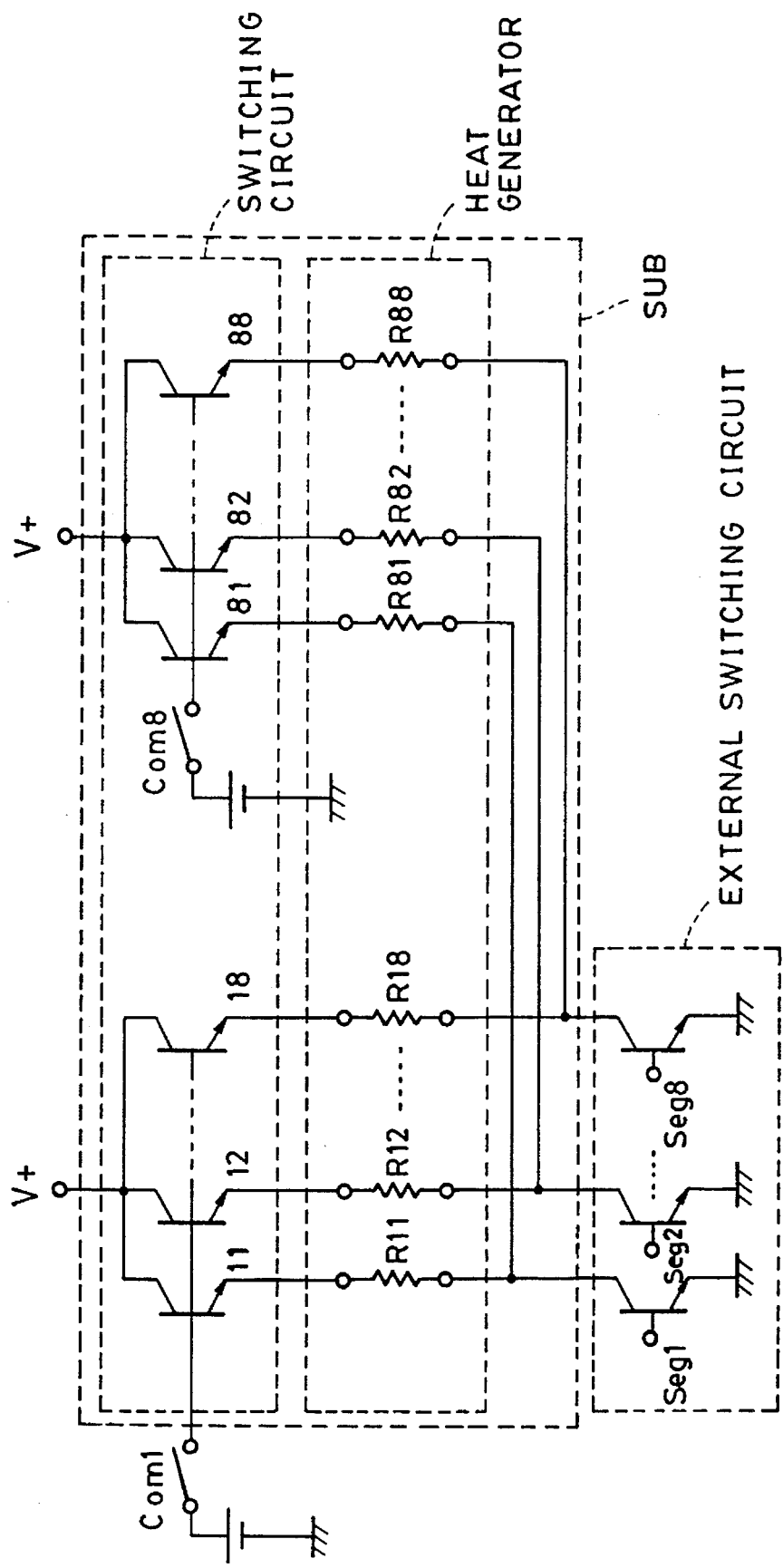
FIG. 2 is a drawing showing a matrix switching circuit of a conventional ink jet recording head using a plurality of transistor switching circuits.
Figure 3:
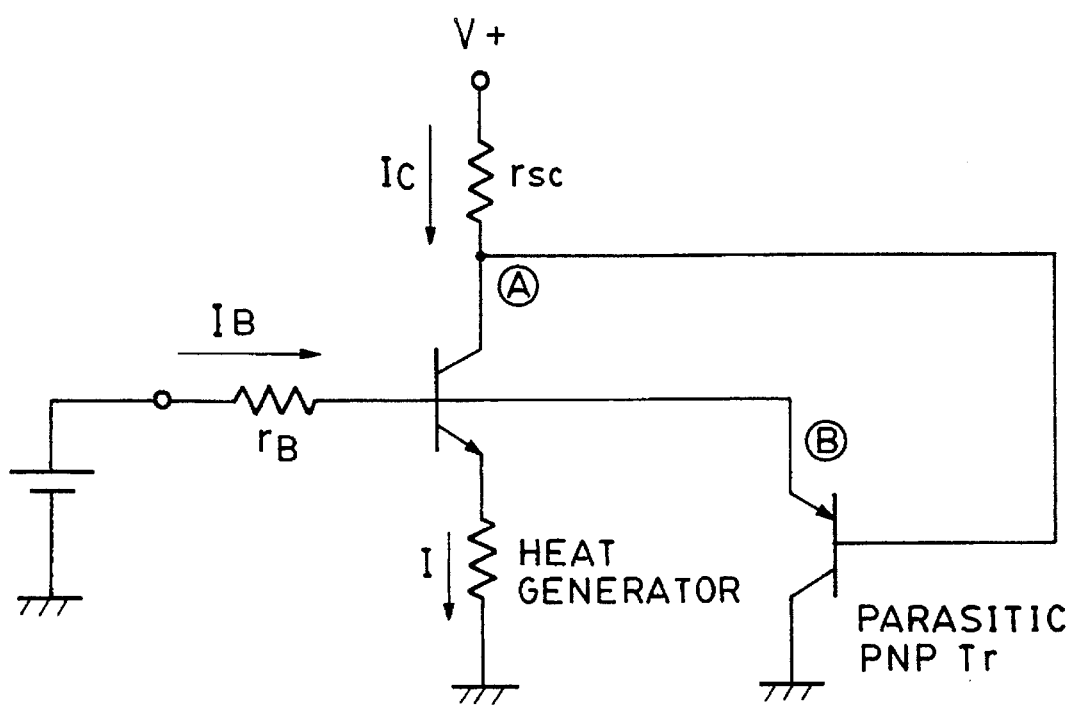
FIG. 3 is a drawing showing an equivalent circuit for one bit of the matrix switching circuit shown in FIG. 2.

A semiconductor device in accordance with an embodiment of the present invention has a first conduction type semiconductor region including a first main electrode region as a drain of a MOS transistor, and a second semiconductor region of the opposite conduction type formed in the first conduction type semiconductor region. A part of the second conductor region serves as a channel of the transistor. The first main electrode region in contact with the channel has a high-resistance portion which improves voltage resistance.

A second main electrode region as a source is formed in the second semiconductor region, and a gate electrode is formed on the channel between the second main electrode region and the high-resistance portion through a gate insulating layer.

Both ends of the gate electrode are respectively aligned with both ends of the channel.

Namely, the semiconductor device of the present invention comprises MOS transistors each having a first conduction type high-resistance layer provided around an n-type source below a gate, a second conduction type epitaxial growth layer provided between the high-resistance layer and a second conduction type drain below the high-resistance layer, a second conduction type buried layer provided below the epitaxial growth layer, and a contact layer provided in the drain so as to contact the buried layer.

At least one block consisting of NMOS transistors is provided, and the gates and the drains of the respective MOS transistors in the block are connected to each other. The sources in the block are respectively connected to the ends of heater resistances, switches for common lines are respectively connected to the gates in the block, and switches for segment lines are respectively connected to the N gates in the block. Each of the sources is connected to a ground point, and the drains are respectively connected in a matrix form to the other ends of the heater resistances to form a matrix switching circuit. The MOS transistors and heat resistors can be provided on a substrate to form a heat generating device. The heat generating device can be combined with a discharge opening for discharging ink and a container for containing ink to form an ink jet head.

In the present invention, an n⁻-type element isolation region without an element is preferably formed in a pnp structure in each of the p-type regions between the respective MOS transistors in which metal wiring is formed for short circuiting the PN junction.

Each of the element isolation regions is preferably formed by a method of forming an element isolation region for dielectrically isolating the MOS transistors. The method comprises the steps of forming openings in a semiconductor substrate, and forming the element isolation regions by filling the openings with an insulator.

The filling step may be performed in two stages; a first stage of covering the bottom and side of each of the openings with the insulator, and a second stage of filling each opening with the insulator after the first stage is completed. The kind of insulator used in the first stage may be different from that used in the second stage. The method may further comprise a step of levelling the insulator to the same height as that of the surface of the semiconductor substrate. This is done after the step of filling the openings with the insulator by removing excess insulator material.

The method may comprise the step of flattening the surface of the semiconductor substrate after the step of filling the openings with the insulator.

In the method of producing the heat generating device, the step of forming wiring electrodes of a heat generator is preferably performed in two exposure stages; a first exposure stage of exposing a photoresist provided on a metal layer which forms the wiring electrodes, at a distance of 40 to 100 μm between the photoresist and the photomask which is provided on the photoresist and has a pattern of the wiring electrodes, and a second exposure stage of exposing the photoresist at a distance of 0 to 14 μm between the photoresist and the photomask.

The production method may further comprise the development step of developing the photoresist after the exposure step, and the etching step of etching the metal layer using as a mask the photoresist formed in the development step while contracting at least the ends of the photoresist by an alkali solution. An aluminum. layer and tetramethylammonium hydroxide may be used as the metal layer and the alkali solution, respectively.

In the present invention, since the n epitaxial layer is provided so that the distance between the source and the drain can be increased, the electrical field strength between the source and the drain is decreased, and the occurrence of hot carriers is thus decreased. The amount of the hot carriers which enter the gate oxide film is thus decreased, thereby preventing the changes in the threshold value ($V_{th}$) and the transconductance ($G_m$) of the nMOS transistor, which are caused by hot carriers in a conventional device. Further, since the provision of the n epitaxial layer causes the formation of a pn junction between the n epitaxial layer and the p⁻ layer, which is generally formed between the drain and the p⁻ layer, the depth of the junction is increased, and the width of a depletion layer at the ends of the layers is also increased, thereby mitigating field concentration and increasing voltage resistance.

Further, since the pn junction in each of the pnp structures respectively provided by forming n-type element isolation regions without elements in the p-type regions between the respective MOS transistors is short-circuited by metal wiring, a parasitic transistor assumes an inoperable state, thereby preventing latch up.

Unlike a conventional thermal oxidation method, the method of the present invention prevents oxidation from proceeding in a portion below the insulating film, thereby preventing the occurrence of bird's beaks.

Additionally, in the first exposure stage where the exposure is at a great distance between the photomask and the photoresist, a region wider than the transmitting pattern of the photomask is exposed by diffracted light which enters the portion below the pattern edge of the photomask. In the second exposure stage in which the distance between the photomask and the photoresist is zero or small, a (completely exposed) region which is not covered with the photomask, a (half exposed) region which is covered with the photomask and subjected to the first exposure, and a (unexposed) region which is covered with the photomask and is not exposed at all can be formed in the photoresist due to small effects of the diffracted light on the pattern edge of the photomask. The photoresist having these three regions is developed to form a tapered edge portion. The metal layer is etched using the photoresist having the tapered edge portion to form a tapered edge portion in the metal layer. In an electrothermal conversion device such as a heat generating head or the like comprising the metal layer having the tapered edge portion and provided on a heat generating resistor, a current flow is not concentrated in a portion below the edge portion of the metal layer, thereby preventing partial cutting of the heat generating resistor. It is thus possible to increase the life of the electrothermal conversion device.

An embodiment of the present invention is described in detail below with reference to the drawings.

Figure 4:
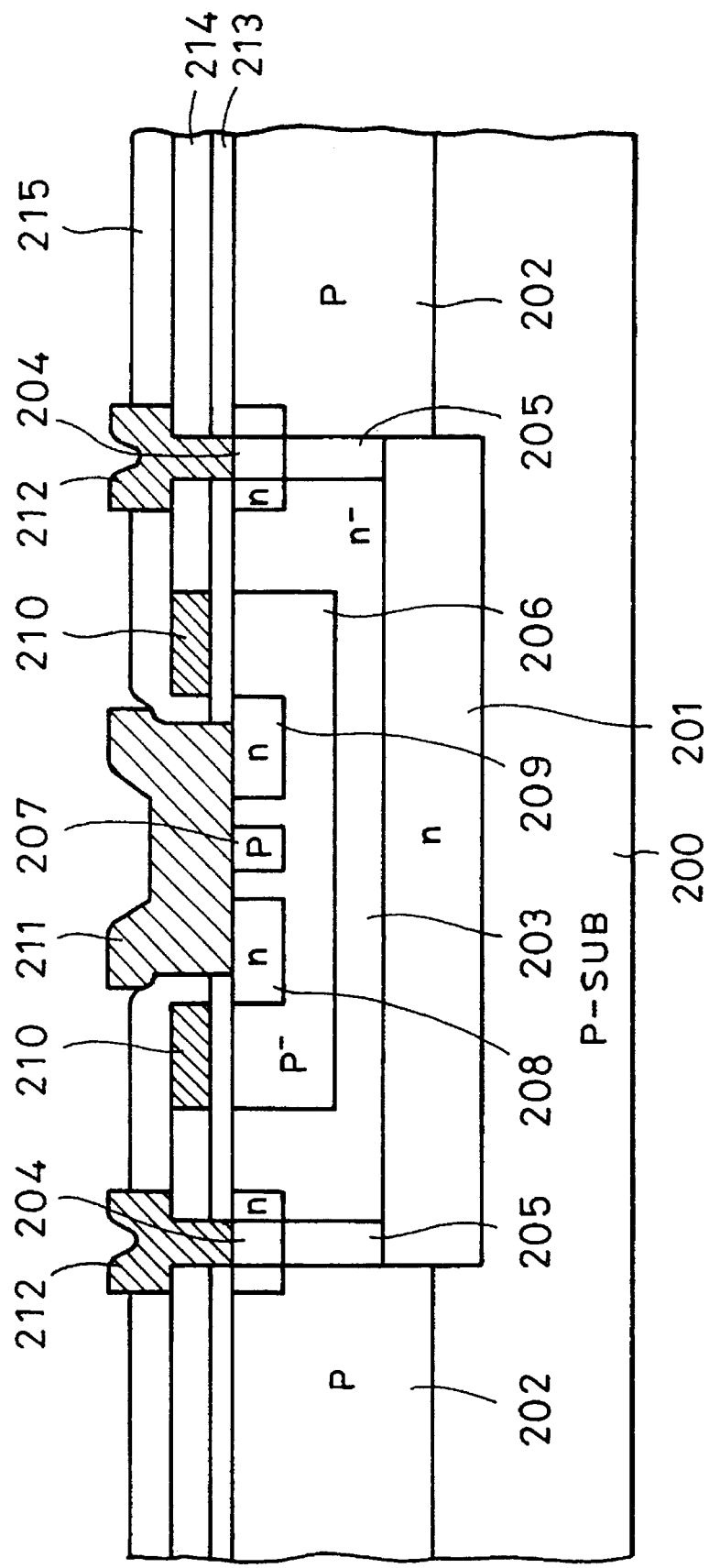
FIG. 4 is a schematic sectional view of a semiconductor device in accordance with an embodiment of the present invention.

FIG. 4 is a longitudinally sectional view showing an example of nMOS transistors in accordance with a first embodiment of the present invention. In FIG. 4, reference numeral 200 denotes a substrate. Although, in this example, single crystal silicon is used as a material for the substrate 200, the substrate material is not limited to this. On a portion of the substrate 200 is formed an n-type buried layer 201 around which a p-type epitaxial (referred to as "epi" hereinafter) layer 202 is formed. On the buried layer 201 is formed an n-type epi-layer 203. A contact layer 205 in contact with an n-type drain 204 is formed around the epi-layer 203 on the periphery of the buried layer 201, and a p⁻ type layer 206 serving as a channel is formed on the epi-layer 203. The p⁻ layer 206 contains a p-type layer 207 and n-type source 208 and 209 formed on both sides of the p-type layer 207.

In the drawing, reference numeral 210 denotes an insulating gate electrode; reference numeral 211, a drain electrode; and reference numeral 212, a source electrode. Reference numerals 213, 214 and 215 each denote an insulating layer. In the nMOS transistor configured as described above, since the low-resistance buried layer 201, the high-resistance n epi-layer 203 and the low-resistance contact layer 205 are provided, the depth of the pn junction between the n epi-layer 203 and the p⁻ layer 206 is increased, and the depletion layer at the ends of the layers is wider than that in a conventional transistor, thereby mitigating the 5 concentration of a field and increasing the voltage resistance of the nMOS transistor.

Figure 5A:
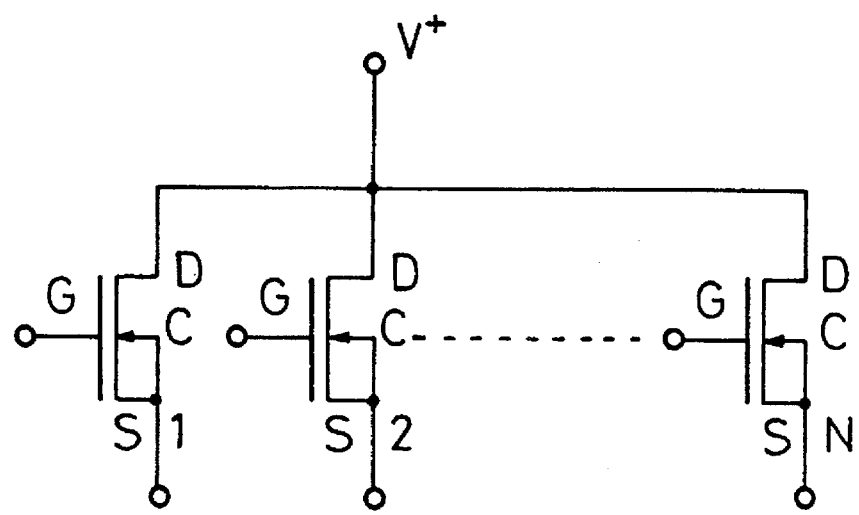
FIG. 5 is a drawing showing a switching circuit formed by using the nMOS transistor shown in FIG. 4.
Figure 5B:
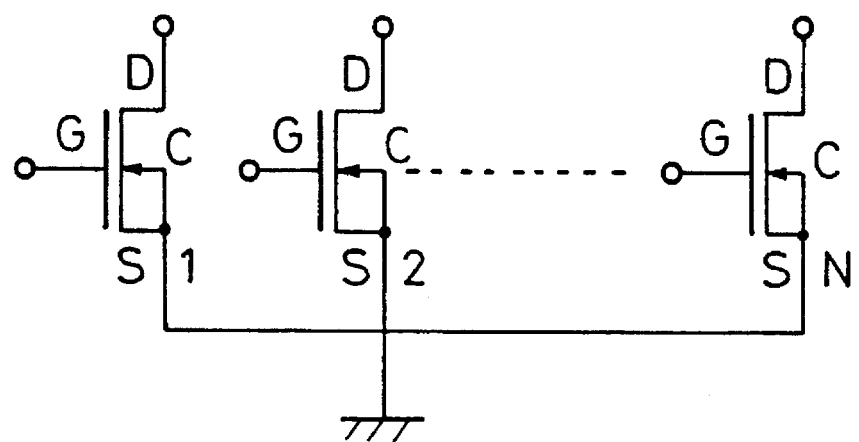

FIG. 5 shows examples of switching circuits comprising the above-described nMOS transistors shown in FIG. 4. FIG. 5(a) shows a switching circuit in which the drains D of N nMOS transistors are connected in parallel. In this example, a voltage V⁺ is applied between the source S and the drain D of each transistor from a power source. FIG. 5(b)

shows a switching circuit in which the sources S of N nMOS transistors are connected in parallel. In this example, the sources are grounded. In such switching circuits, the voltage resistance between the source and the drain of each nMOS transistor is at least 80 V. Further, since substantially no current flows through the gate 210 of each of the nMOS transistors, a current for controlling the nMOS transistors becomes substantially zero. Even if the N nMOS transistors are simultaneously driven, the current consumption can thus be significantly decreased, as compared with a conventional circuit.

Figure 6:
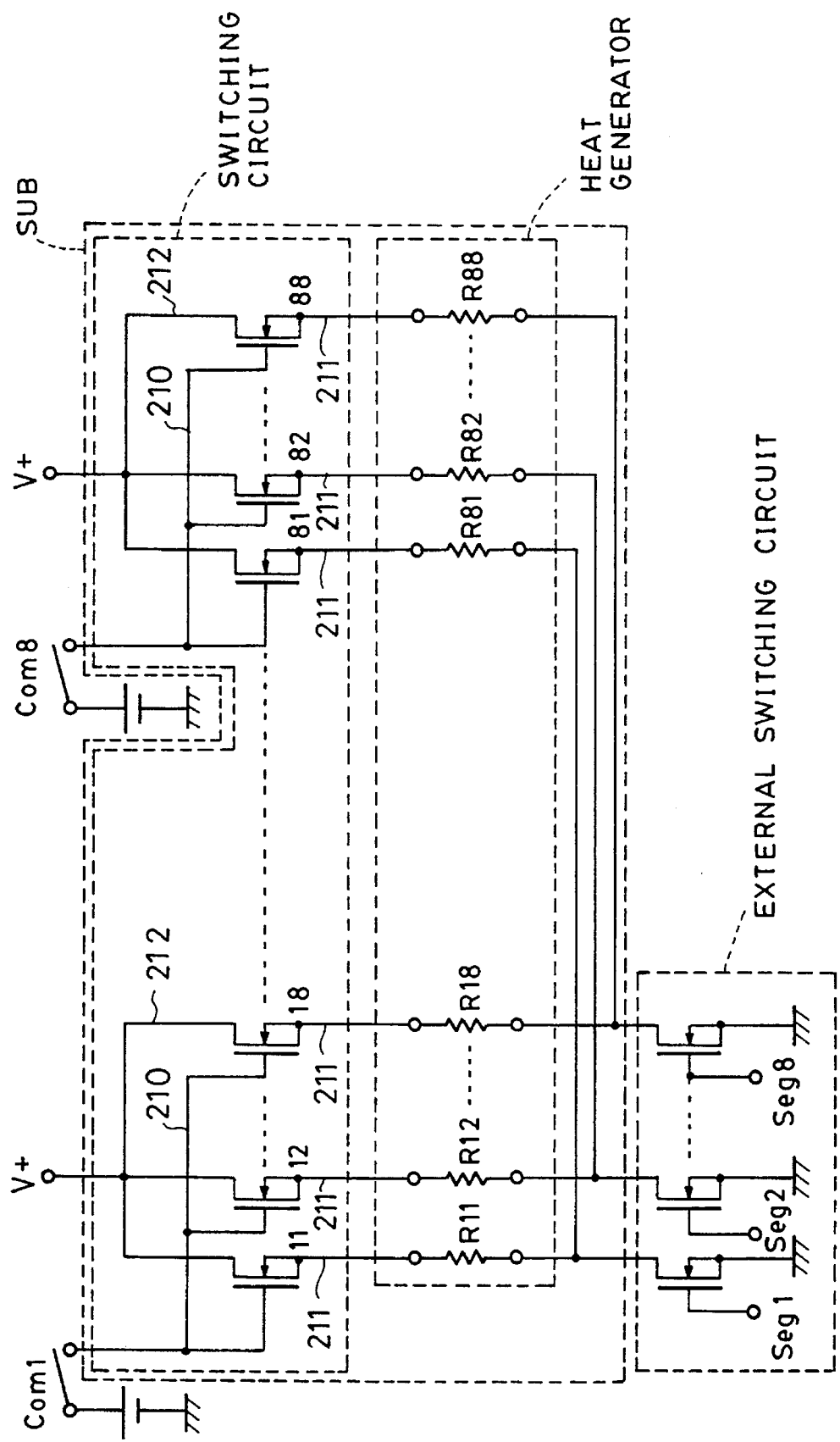
FIG. 6 is a drawing showing a matrix switching circuit for driving an ink jet recording head in which the nMOS switching circuits shown in FIG. 4 are arranged in a matrix form.

The nMOS switching circuits shown in FIG. 5 may be arranged in a matrix to form, for example, a matrix switching circuit for driving an ink jet recording head, as shown in FIG. 6. The switching circuit shown in FIG. 6 is operated by applying a voltage $V^+$ of about 30 to 40 V to each terminal. In the switching circuit, since substantially no current flows through the gate of each of MOS transistors 11, . . . 18, . . . 81, . . . 88, the current flowing through 8 external switches for common lines is substantially zero, thereby simplifying the arrangement of the switches for the common lines.

The use of the above configuration permits a matrix switching circuit which is generally realized by using a plurality of chips to be formed by arranging the switches both for the common lines and segment lines in the same chip, and thus permits the formation of a matrix switching circuit on a single chip.

Figure 7:
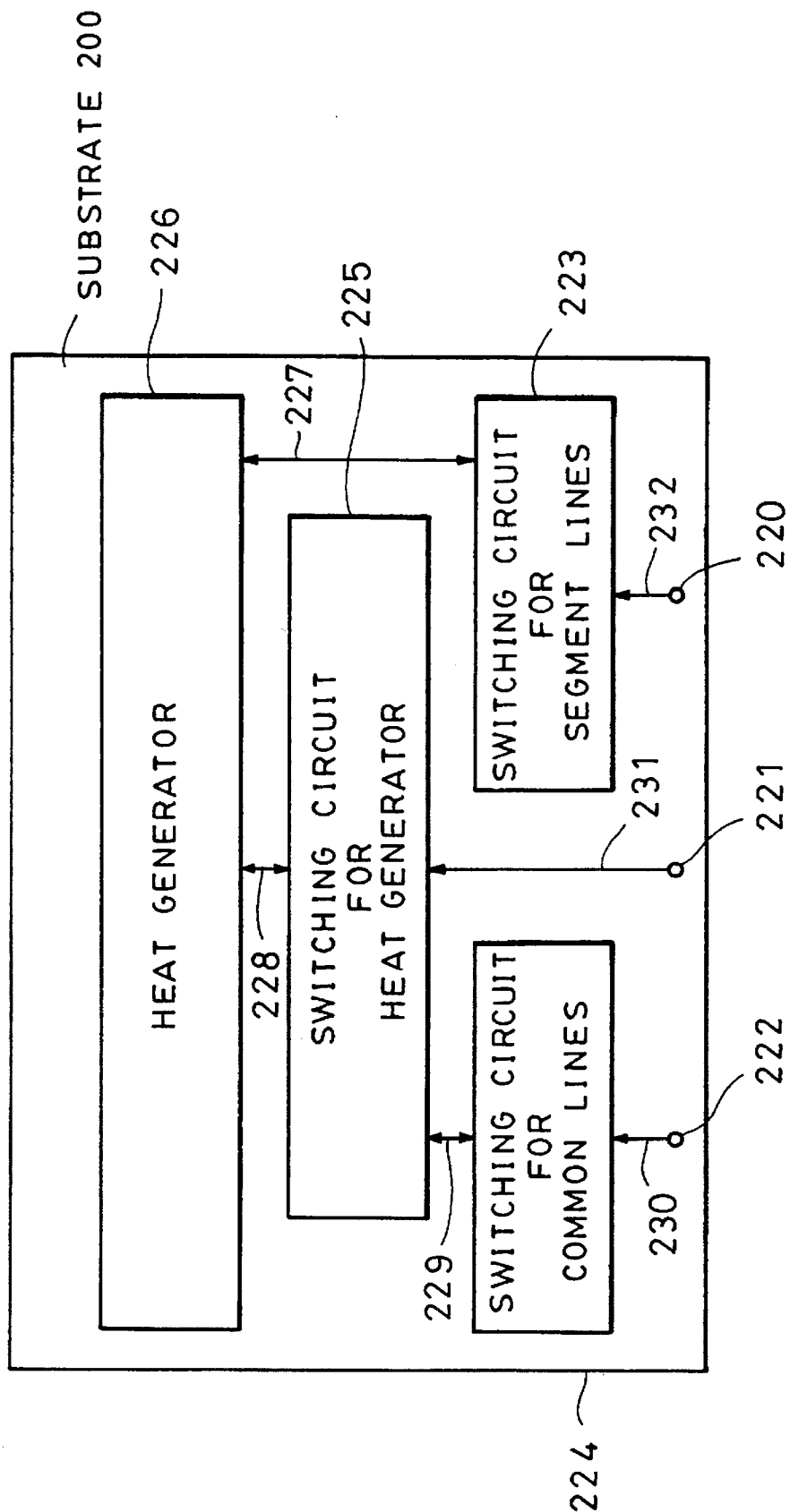
FIG. 7 is a block diagram showing a semiconductor device in accordance with another embodiment of the present invention.

FIG. 7 is a schematic plan view showing the circuit configuration of a one-chip semiconductor device for driving a heat generator.

On a common substrate 200 are integrally provided a heat generator 226 comprising a plurality of heat generating resistances, a heat generator switching circuit 225 comprising nMOS transistors having the sectional structure shown in FIG. 4, a common line switching circuit 224 comprising switches Com1, . . . Comb8 for supplying a gate voltage to a common line 229 of each of the nMOS transistor blocks, and a segment line switching circuit 223 for selectively holding the segment lines of the heat generator 226 at a reference potential.

In FIG. 7, reference numeral 210 denotes a terminal for supplying a signal for controlling the switching circuit 223 through a line 232, reference numeral 221, a terminal for supplying the voltage $V^+$ for supplying a current to the heat generator 226 through a power source line 231, and reference numeral 222, a terminal for supplying a signal for driving the common line switching circuit 224 through a line 230 so as to supply a gate voltage required for turning the gates of the nMOS transistors 11, . . . 18, . . . 81, . . . 88 through a line 229.

Figure 8A:
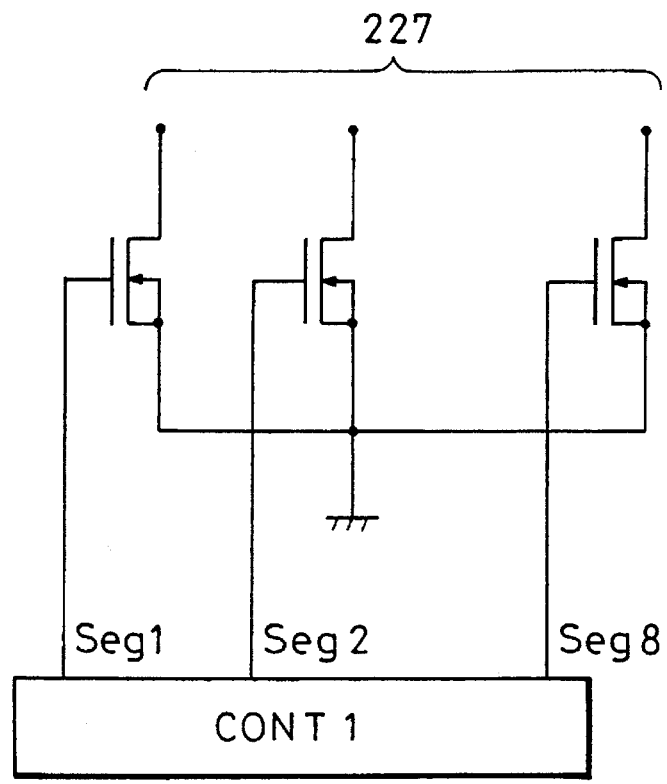
FIG. 8 is a drawing showing two examples of the switching circuits for segment lines of the semiconductor device shown in FIG. 7.
Figure 8B:
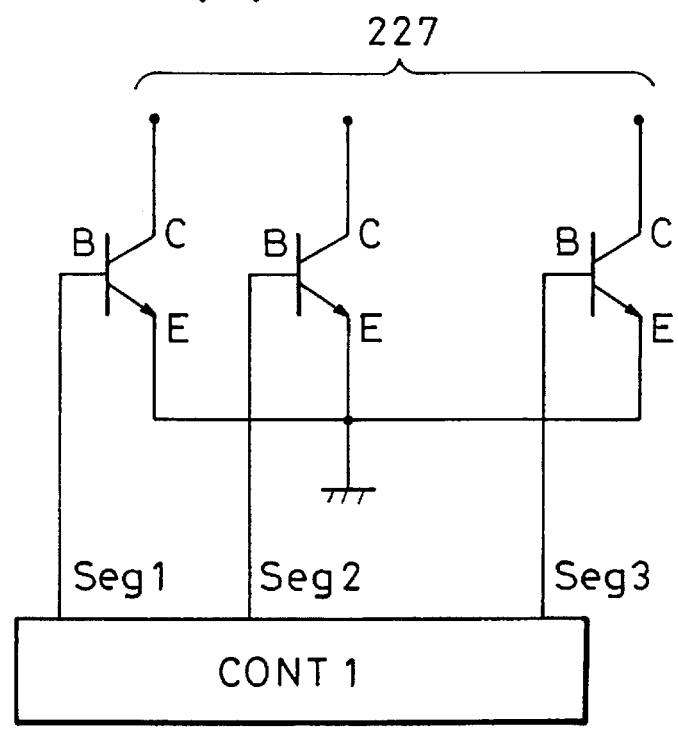

FIG. 8 a drawing showing examples of the configuration of the switching circuit 223 shown in FIG. 7.

FIG. 8(a) shows an example which uses the same MOS transistors as that shown in FIG. 4, and FIG. 8 (b) shows an example which uses bipolar transistors.

In FIGS. 8 (a) and 8 (b), CONT1 denotes a control circuit for selectively supplying a signal to be supplied to the gates (or bases) of the transistors in accordance with image information. The CONT1 may function as a shift register, a latch circuit, an AND gate or the like.

FIG. 9 is a drawing showing examples of the configuration of the switching circuit 224 shown in FIG. 7.

Figure 9A:
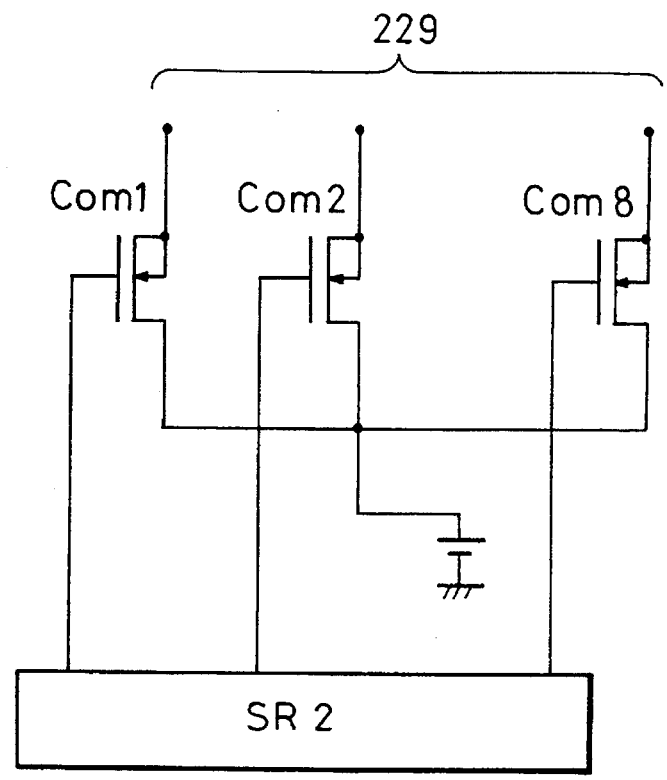
FIG. 9 is a drawing showing two examples of the switching circuits for common lines of the semiconductor device shown in FIG. 7.
Figure 9B:
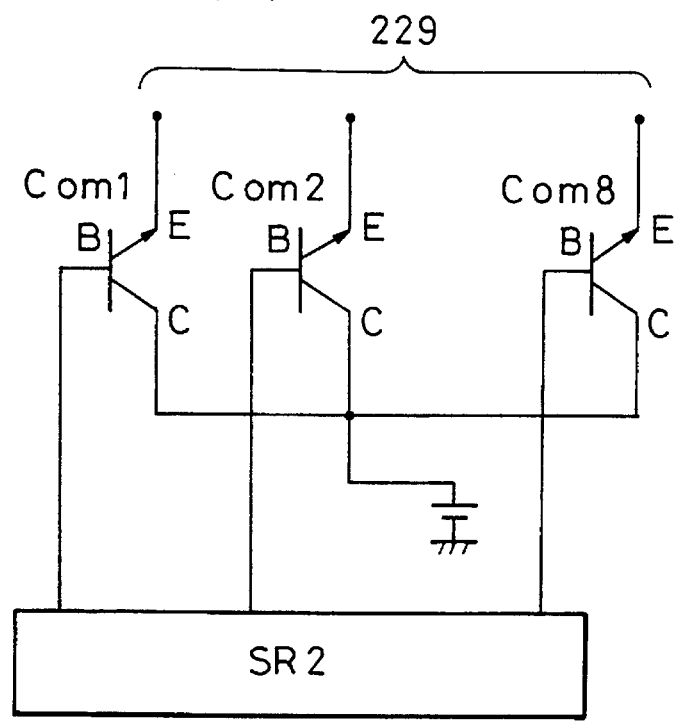

FIG. 9(a) shows an example which uses the same MOS transistors as that shown in FIG. 4, and FIG. 9(b) shows an example which uses bipolar transistors.

In FIGS. 9(a) and 9(b), SR2 denotes a shift register for successively supplying a shift pulse to the transistors Com1, Co2, . . . Com8 so as to drive the 8 blocks of heat generating resistors $R_{11}$, . . . $R_{18}$, . . . $R_{81}$, . . . $R_{88}$ in a time series.

FIG. 10 is a partial sectional view of the semiconductor device shown in FIG. 7. Referring to FIG. 10, a nMOS transistor having the same structure as that shown in FIG. 4 and a bipolar transistor having the heat generator 226 and the switching circuit 224 are integrally formed.

The nMOS transistor is formed so that the region as a first semiconductor region surrounded by a buried layer 301, an n-type contact layer 305 and a drain 304 contains a high-resistance n-type layer 303, a p-type layer 306 as a second semiconductor region, a source 308 as a second main electrode region and a channel contact 307. On the first semiconductor region a drain electrode 312, a gate electrode 310 and a source electrode 311 are formed.

FIG. 10 also shows an example of the configuration of the switching circuit 224 which uses the circuit shown in FIG. 9(b). Namely, FIG. 10 shows the section of an npn bipolar transistor having a collector comprising a buried layer 331, a contact layer 335, an n-type layer 334, and $n^-$ layer 333, a base comprising a $p^-$ layer 336 and a p-type layer 337, and an emitter 338. An electrothermal converter as a heat generator is formed on the end side of the substrate 300. The electrothermal converter has a heat generating resistance layer 318 and an electrode 319, a portion without the electrode serving as a heat generating portion 321.

An insulating layer 316 serving as a base for forming the electrothermal converter is flattened. The electrode 319 is thus connected to the source electrode 311 through a plug 322 formed therebetween by selective deposition of tungsten (W) or aluminum (Al). An end 320 of the electrode 319 is tapered by the lithography described below.

In FIG. 10, reference numeral 317 denotes a protective layer, reference numerals 313 and 315 each denote an insulating layer, reference numeral 342 denotes a collector electrode, reference numeral 340 denotes a base electrode, and reference numeral 341 denotes an emitter electrode.

Figure 11:
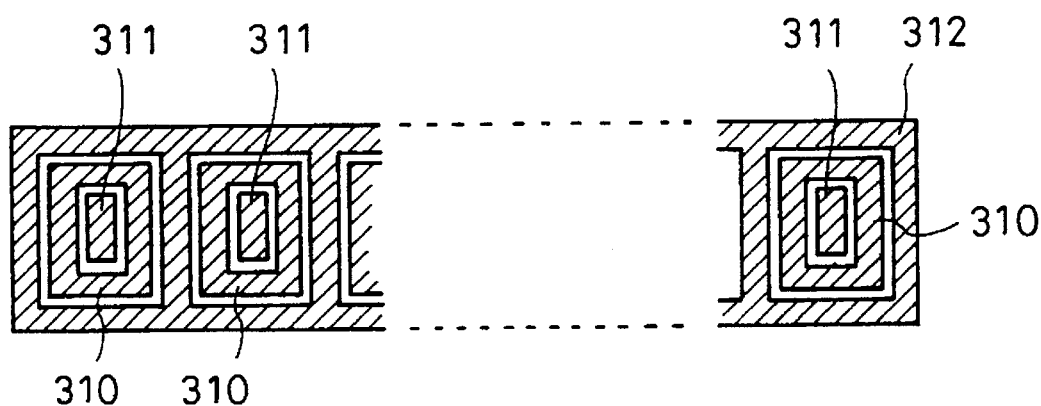
FIG. 11 ms a schematic top view illustrating the arrangement of MOS transistors used in the present invention.

The n-type semiconductor which forms the drain of the switching circuit 225 is common to all nMOS transistors. FIG. 11 is a schematic top view illustrating the state wherein the n-type semiconductor is common to all transistors. In FIG. 11, the gate electrodes 310 and the source electrodes 311 of the MOS transistors are arranged in a region surrounded by the drain electrode 312.

Figure 12:
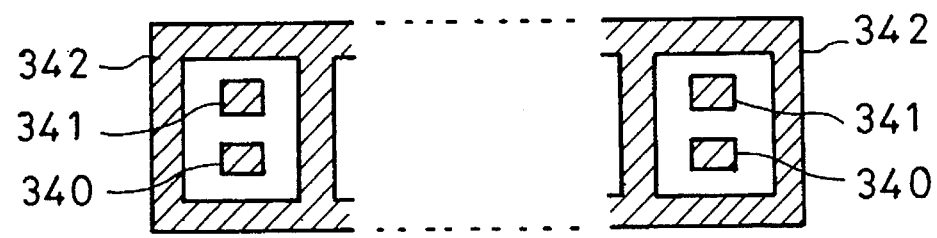
FIG. 12 is a schematic top view illustrating the arrangement of bipolar transistors used in the present invention.

Similarly, the n-type semiconductor which forms the collector of the switching circuit 224 is common to all npn bipolar transistors. FIG. 12 is a schematic top view illustrating the state wherein the collector region is common to all transistors. In FIG. 12, the base electrodes 340 and emitter electrodes 341 are provided in regions surrounded by the collector electrode 342.

These electrodes are connected to each other by wiring so as to produce the circuit configured as shown in FIG. 6.

A brief description will be made of a method of producing the semiconductor device shown in FIG. 10.

The buried layers 301 and 331 are formed by injecting an n-type dopant into predetermined regions of a prepared p-type semiconductor wafer, and the $n^-$ type epitaxial layers 303 and 333 are then formed. A p-type dopant is then diffused in portions other than the element regions to form the p-layer 302 serving as element isolation regions.

An n-type dopant is then partially diffused in the $n^-$ epitaxial layers 303 and 333 to form the n-type contact layers 305 and 335. A p-type dopant is injected into the n⁻ epitaxial layers 303 and 333 to form the p⁻ layers 306 and 336, respectively, followed by heat treatment. A p-type dopant is then injected into the p⁻ layers 306 and 336 to form the p-type layer 307 and the p-type layer 337 in the base. An n-type dopant is then injected to form the source regions 308 and 309, the emitter region 338, the drain region 304 and the collector n-type layer 334, followed by heat treatment.

The electrothermal converter, each electrode and the insulating layer are then formed by known processes.

The above configuration permits the nMOS transistors and npn transistors to be formed by the same production process, and the switching circuits 223 and 224 serving as peripheral circuits in a driving system to be easily integrated on one chip The thus-formed semiconductor device having the structure shown in FIG. 10 can be used as a thermal head as it is, and an ink jet head can be formed by providing members for forming an ink passage and an ink discharge opening on the device shown in FIG. 10.

A description will now be made of the element isolation structure used in the semiconductor device of the present invention.

Figure 13:
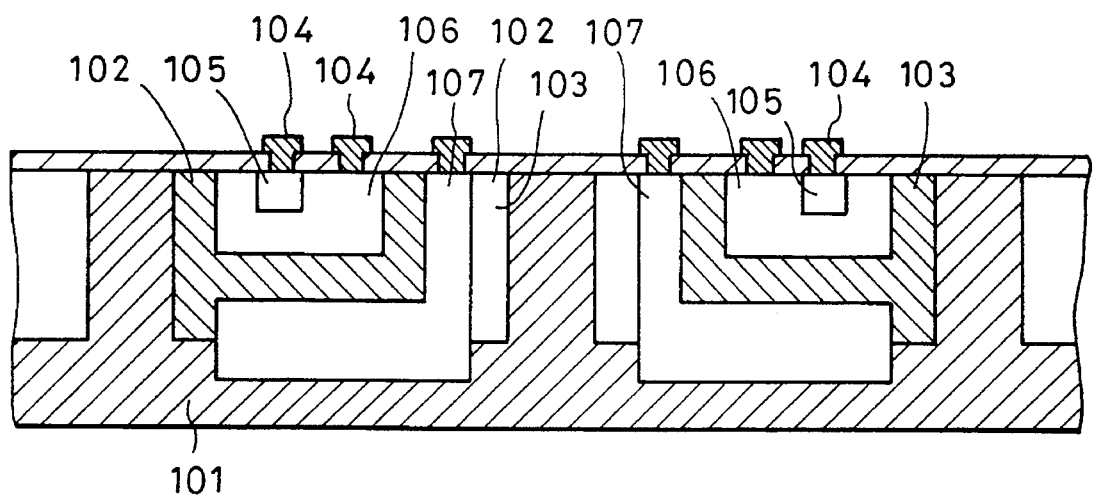
FIG. 13 is a schematic sectional view illustrating an element isolation structure in a semiconductor device.

An element isolation structure in a semiconductor device circuit is formed by using a reversely biased pn junction, as shown in FIG. 13. In FIG. 13, reference numeral 101 denotes a p-type substrate, reference numerals 102 and 103 each denote an n⁻ region in which a semiconductor element is formed, reference numeral 104 denotes a wiring metal, reference numeral 105 denotes an n⁺ region serving as an emitter, reference numeral 106 denotes a p-type region serving as a base, and reference numeral 107 denotes an n⁺ region serving as a collector.

However, the element isolation structure shown in FIG. 13 has the drawback that latch up easily occurs due to an increase in the lowest voltage of an integrated circuit caused by noise or the like when npn transistors operated in a saturation state are adjacent to each other. In the worst case, this possibly results in the breakage of an element.

Figure 14:
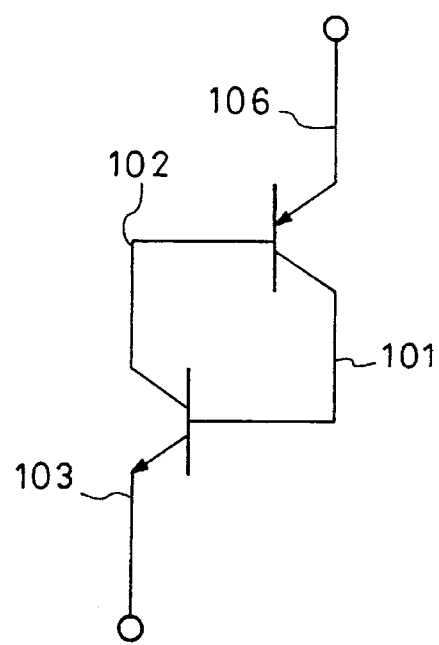
FIG. 14 is a drawing showing an equivalent circuit of a parasitic transistor formed in the element isolation structure shown in FIG. 13.

FIG. 14 is a drawing showing an equivalent circuit of a parasitic transistor formed in the element isolation structure shown in FIG. 13. If noise occurs in the substrate 101 so as to bring the pn junction into the forward state when the transistors in the n⁻ epitaxial regions 102 and 103 are saturated, the parasitic npn transistor is operated, and the parasitic pnp transistor is thus operated. This causes positive feedback and thus the problem that a current continuously flows after the noise disappears.

Figure 15:
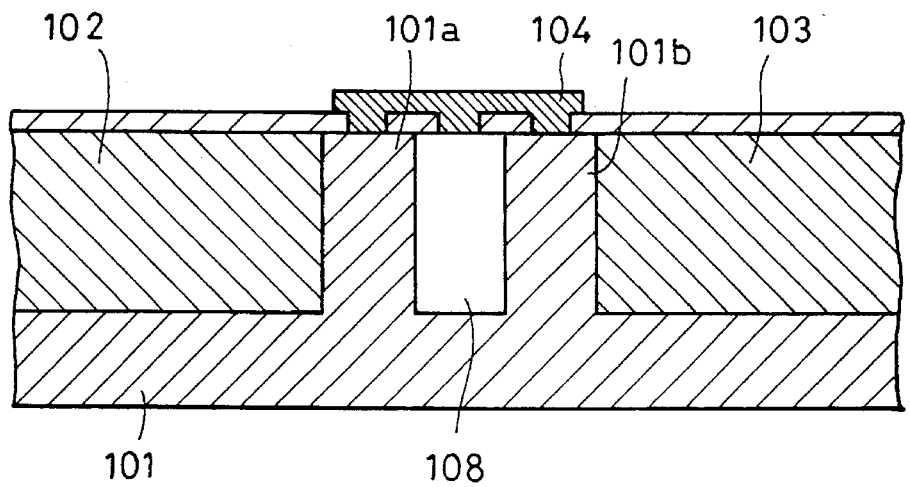
FIG. 15 is a longitudinal sectional view showing an example of the element isolation structure used in the present invention.

FIG. 15 is a longitudinally sectional view showing an example of element isolation structure used in the present invention. Some of the components shown in FIG. 15 are the same as those in the conventional element isolation structure shown in FIG. 13, and the same components are denoted by the same reference numerals and are not described below. In FIG. 15, recessed portions are formed at predetermined intervals in the p-type substrate 101, and n⁻ regions 102 and 103 are provided in the recessed portions in order to form semiconductor elements therein. Other recessed portions are formed in portions of the p-type substrate 101 between the respective n⁻ epitaxial regions 102 and 103, and the n⁻ epitaxial regions 108 where no semiconductor element is formed are respectively formed in the other recessed portions. The upper portion of each n⁻ epitaxial region 108 and the upper ends 101a and 101b of portions of the p-type substrate 101 which hold the n⁻ epitaxial region 108 therebetween are short-circuited by the wiring metal 104.

Figure 16:
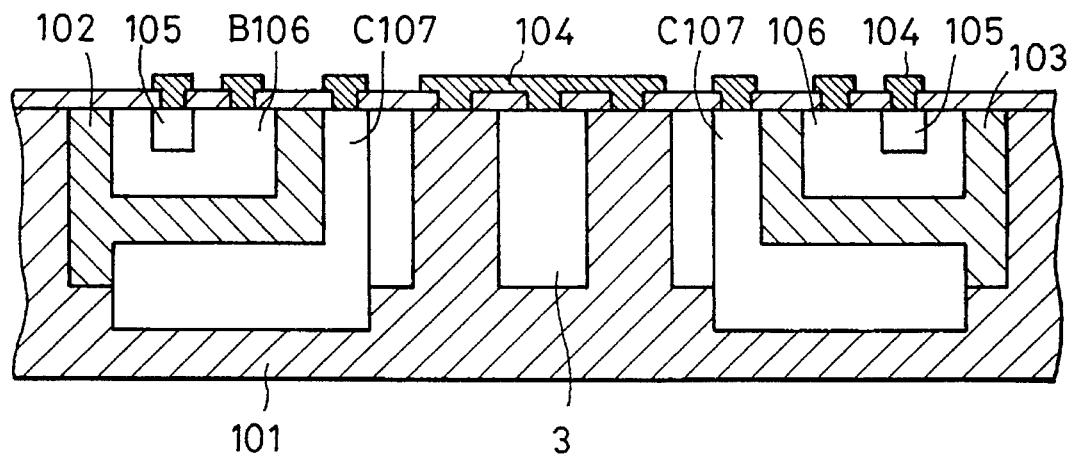
FIG. 16 is a sectional view of the element isolation structure shown in FIG. 15 in which a semiconductor element is formed in an n⁻ epitaxial region.
Figure 17:
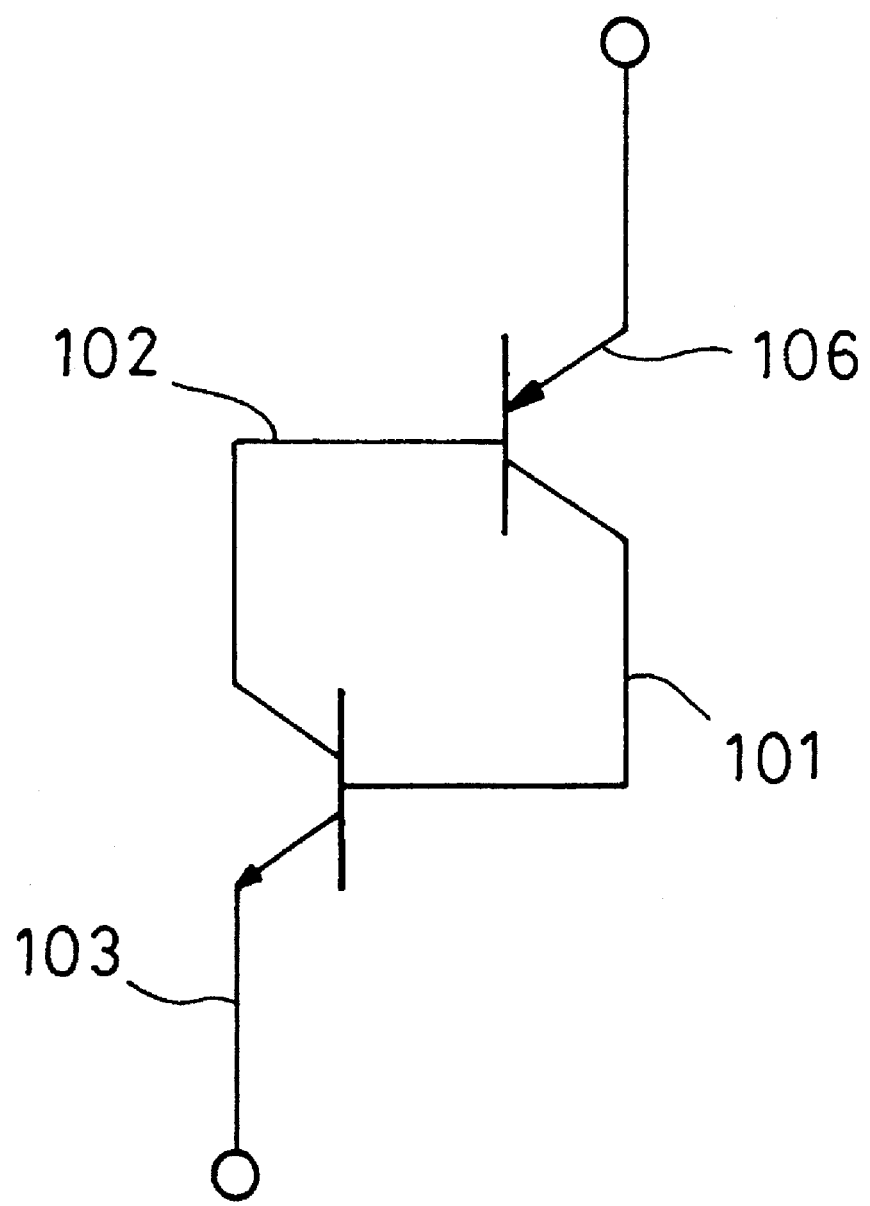
FIG. 17 is a drawing showing an equivalent circuit of a parasitic transistor formed in the element isolation structure shown in FIG. 16.

FIG. 16 shows an example in which a semiconductor element is formed in each of the n⁻ epitaxial regions 102 and 103 in the above-described element isolation structure. In the element isolation structure shown in FIG. 16, an n⁺ region 105 serving as an emitter, a p-type region 106 serving as a base, and a n⁺ region 107 serving as a collector are formed in each of the n⁻ epitaxial regions 102 and 103, as in the element isolation structure shown in FIG. 13. FIG. 17 shows the equivalent circuit of a parasitic transistor formed in the element isolation structure shown in FIG. 16. In the circuit, when the npn transistor formed in each of the n⁻ epitaxial regions 102 and 103 is operated in the saturation state, the potentials of the n⁻ epitaxial regions 102 and 103 are substantially the same as the saturation potential of the npn transistors. The n⁺ emitter region 105 of each of the npn transistors is connected to the lowest potential, and a forward bias potential of a pn junction is produced in the p-type base region 106. In this state, when noise occurs in the substrate 101 so as to produce a forward potential of a pn junction, since the emitter region of the parasitic npn transistor is an n⁻ region without an element, and since the emitter region and the substrate 101 are short-circuited by the wiring metal 104, the base emitter of the npn parasitic transistor is short-circuited. The parasitic npn transistor thus assumes an inoperable state, thereby preventing the occurrence of latch up.

Examples of element isolating methods that can be used in the embodiment include the short-circuit pn-type shown in FIGS. 15 to 17 and the buried type element isolating method described below.

FIG. 18 shows another known element isolating method used for a semiconductor integrated circuit. As shown in FIG. 18(a), an insulating film 122 is first formed on a semiconductor substrate 121. An insulating film 123 made of an insulating material different from that of the insulating film 122 is then deposited on the insulating film 122 by the LP-CVD process, as shown in FIG. 18(b). Portions of the insulating films 122 and 123, where an element insulation region is formed, are removed by patterning to form an opening 124, as shown in FIG. 18(c). The semiconductor substrate 121 having the opening 124 is treated by a thermal oxidation method at a high temperature for a long time to form an element isolation region 125 comprising an oxide film, as shown in FIG. 18(d). Since the element isolation region 125 is coated with the insulating films 122 and 123, oxidation does not proceed.

Figure 18A:
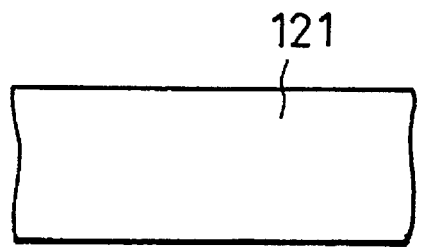
FIG. 18 is a schematic sectional view illustrating, in a time series manner, a process of forming the element isolation structure in a conventional semiconductor integrated circuit.
Figure 18B:
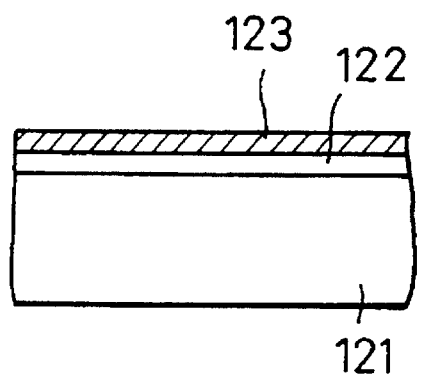
Figure 18C:
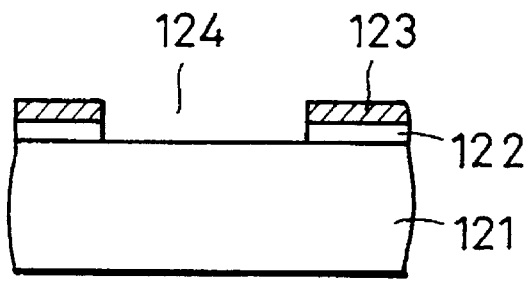
Figure 18D:
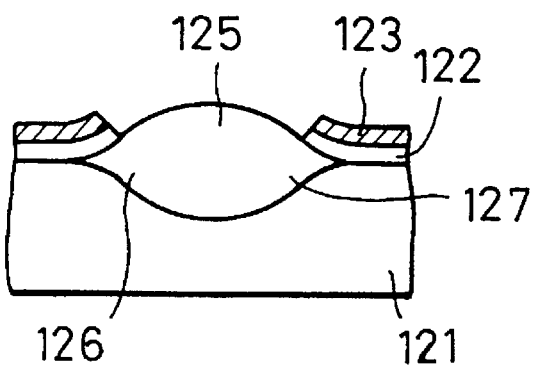
Figure 19A:
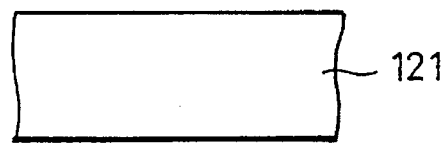
FIG. 19 is a sectional view illustrating, in a time series manner, an example of a process of forming the embedded element isolation structure used in the present invention.
Figure 19B:
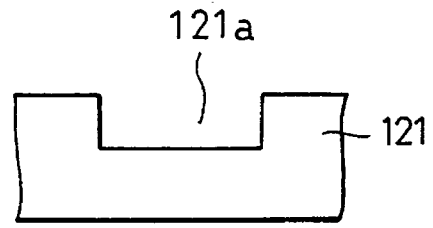
Figure 19C:
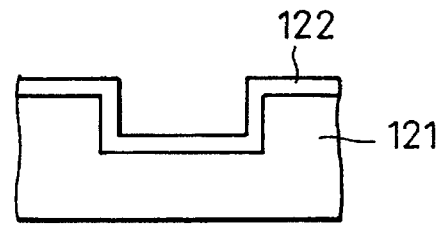
Figure 19D:
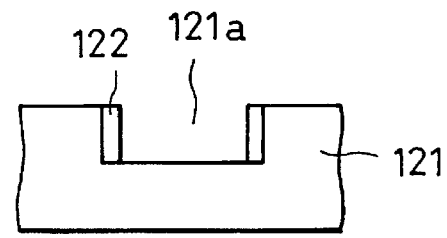
Figure 19E:
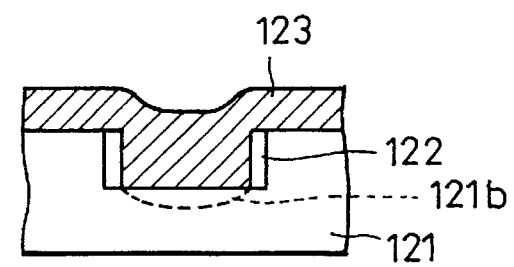
Figure 19F:
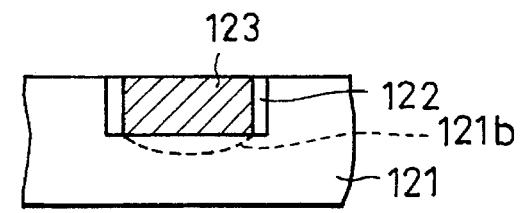
Figure 20A:
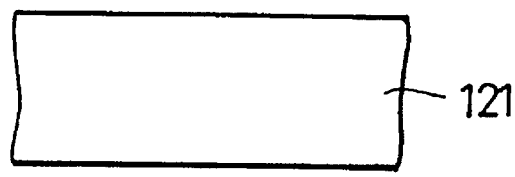
FIG. 20 is a sectional view illustrating, in a time series manner, another example of a process of forming the embedded element isolation structure used in the present invention.
Figure 20B:
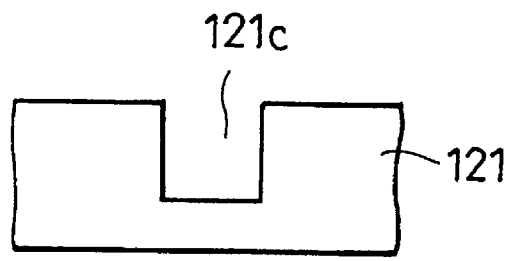
Figure 20C:
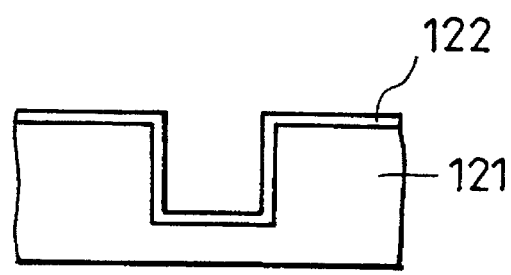
Figure 20D:
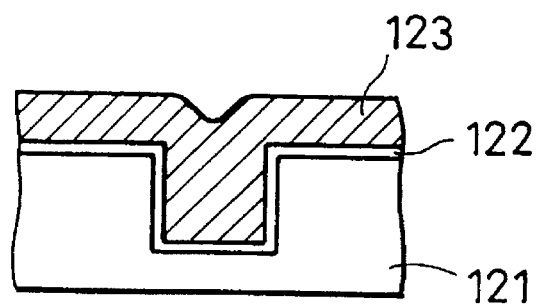
Figure 20E:
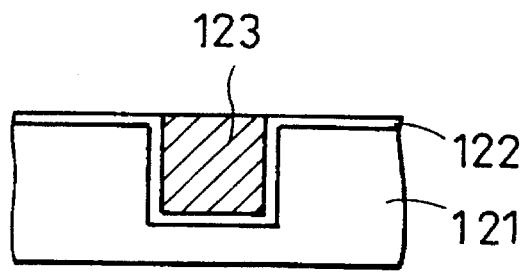

However, in the conventional element isolation method by thermal oxidation shown in FIG. 18, oxidation proceeds in a portion below the insulating films during growth of the oxide film on the semiconductor substrate 121. Both ends of the element isolation region thus rise to form so-called bird's beaks 126 and 127, as shown in FIG. 18(d). The membrane stress between the bird's beaks 126 and 127 and the insulating films 122 and 123 easily causes crystal defects in the semiconductor substrate 121, and thus there is the danger of significantly affecting the electrical characteristics of an element.

Even when the element dimensions are decreased, the number of elements formed on the semiconductor substrate cannot be increased unless the length of the bird's beaks 126 and 127 is decreased. The element isolation method thus has the drawback that the production yield of elements is decreased due to the occurrence of the crystal defects in the semiconductor substrate.

The isolation method also has the drawback that since an oxide film is also formed on the surface of the semiconductor substrate due to the formation of the element isolation region by thermal oxidation method, extensive unevenness occurs in the surface of the semiconductor substrate, and thus may possibly produce breaking of a wire when multilayer wiring is formed. This further decreases the yield of a highly-integrated semiconductor device with a gate length of 1 μm or less.

FIGS. 19 and 20 each show an element isolation structure in which the above drawbacks are removed. Some of the components shown in either FIG. 19 or 20 are the same as those of the conventional element isolation structure shown in FIG. 18, and the same components are denoted by the same reference numerals and are not described below.

An example of methods of forming the buried type element isolation structure shown in FIG. 19 is described below. An opening 121a is formed in the surface of the semiconductor substrate 121 by patterning by dry etching or the like, as shown in FIGS. 19(a) and 19(b). The aspect ratio of the opening 121a is about 0.1 to 5.0. Generally, an aspect ratio is defined by a ratio of depth to diameter of an opening. A first insulating film 122 comprising NSG, PSG, BPSG, a thermal oxide film, SiN, P-SiN, BSQ or the like is then formed to a thickness of 50 to 5000 Å on the surface of the semiconductor substrate 121 including the inner surface of the opening 121a by a thermal oxidation process, CVD process, LP-CVD process, P-CVD process, bias sputtering process or the like, as shown in FIG. 19(c). The first insulating film 122 is then selectively etched by an etchback method, leaving only the portion of the insulating film 122 formed on the side wall of the opening 121a, as shown in FIG. 19(d). Alternatively, only the portion of the first insulating film 122 at the bottom of the opening 121a may be removed by etching, leaving the portions of the first insulating film 122 on the semiconductor substrate 121 and the wide wall of the opening 121a. A second insulating film 123 comprising PSG, BPSG, SOG or the like is then deposited so as to cover the whole opening 121a at least the bottom of which is exposed, as shown in FIG. 19(e). The thickness of the second insulating film 123 may be a value, specifically 1000 to 20000 Å, which enables the opening 121a to be completely filled with the insulator. Impurities of P, B, As or the like are then contained in the portion of the second insulating film 123 in the opening 121a. Heat treatment is then performed at a temperature of 600° to 1200° C. in an atmosphere of $N_2$ or $N_2/O_2$ to smooth the surface of the second insulating film 123 while inhibiting the occurrence of unevenness near the surface of the opening 121a, as well as diffusing the impurities contained in the second insulating film 123 into the semiconductor substrate 121 to form an impurity region 121b only at the bottom of the opening 121a. The impurity region 121b is used as an element isolation region for electrically isolating semiconductor devices of different conduction types or semiconductor devices having different levels of conductivity, which are arranged with the element isolation region therebetween on a substrate. The impurity concentration of the impurity region 121b is $1\times10^{14}$ to $1\times10^{20}$ cm$^{-3}$. The second insulating film 123 is then removed by the etchback method, leaving only the portion of the second insulating film 123 in the opening 121a, as shown in FIG. 19(f).

The buried type element isolation method can prevent the occurrence of the bird's beaks which are produced by the conventional buried type element isolation method shown in FIG. 18, and can prevent the occurrence of crystal defects in the circumference and an enlargement of the element isolation region. In the element isolation method shown in FIG. 19, since the element isolation region is formed by diffusing impurities in the portion of the insulating film in the opening, the element isolation region can be formed in a self-alignment manner, and the isolation region and the impurity region can simultaneously formed, thereby further flattening the surface of the semiconductor substrate.

FIG. 20 shows another example of buried type element isolating methods. An opening 121c is formed in the surface of the semiconductor substrate 121 by patterning by dry etching or the like, as shown in FIGS. 20(a) and 20(b). The aspect ratio of the opening 121c is about 0.1 to 5.0. A first insulating film 122 comprising NSG, PSG, BPSG, SiN, P-SiN, P-SiO or the like is then formed to a thickness of 50 to 5000 Å on the surface of the semiconductor substrate 121 including the inner surface of the opening 121c by the atmospheric CVD process, LP-CVD process, P-CVD process or the like, as shown in FIG. 20 (c). A second insulating film 123 comprising NSG, PSG, BPSG, SiN, P-SiN, P-SiO or the like is deposited so as to cover the whole opening 121c, as shown in FIG. 20(d). The material of the first insulating film 122 may be the same as or different from that of the second insulating film 123. The thickness of the second insulating film 123 may be a value, specifically 1000 to 20000 Å, which enables the opening 121a to be completely filled with the insulator. If required, heat treatment may be then performed at a temperature of 600° to 1200° C. in an atmosphere of $N_2$ or $N_2/O_2$. The second insulating film 123 is then removed by the etchback method, leaving only the portion of the second insulating film 123 in the opening 121c, as shown in FIG. 20(e). The second insulating film 123 in the opening 121c can be used as an element isolation region.

This buried type element isolating method can prevent the occurrence of bird's beaks which are produced in the buried type element isolation method shown in FIG. 18, and thus prevent the occurrence of crystal defects in the periphery thereof and an enlargement of an element isolation region. In addition, since an opening is formed so that element isolation insulating films can be formed without the need for depositing several kinds of insulating films before an thermal oxide film for isolating elements is formed, unlike the conventional method, an element isolation region can easily be formed.

A description will now be made of an electrode forming method employed for forming the tapered portion of an electrothermal converter used in the present invention.

Wiring and an electrode of a heat generator are formed by, for example, a technique of finely processing aluminum. With a high degree of integration, dry etching is used as the technique of finely processing aluminum in view of the processing accuracy. With a relatively high or low degree of integration, wet etching using a chemical solution is used as the technique in view of the simplicity of the processing apparatus used and the low cost.

FIG. 21 is a longitudinally sectional view showing a conventional method of forming a wiring electrode using the technique of finely processing aluminum.

Figure 21A:
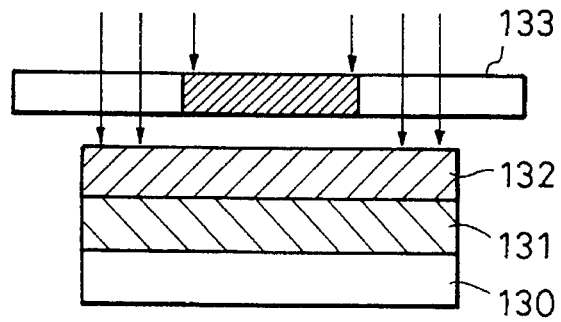
FIG. 21 is a sectional view illustrating, in a time series manner, a process of forming a wiring electrode using a technique of finely processing aluminum.
Figure 21B:
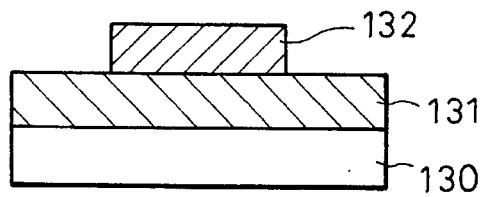
Figure 21C:
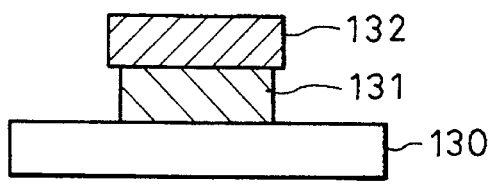

An Al layer 131 as a wiring electrode material is first formed over the whole surface of a substrate 130 made of, for example, Si or SiO$_2$, as shown in FIG. 21(a). A mask photoresist film 132 is then coated over the whole surface of the Al layer 131. A glass photomask 133 is brought near the photoresist film 132, and regions of the photoresist film other than a wiring electrode pattern are exposed. After the glass photomask 133 is then separated from the substrate 130, the wiring electrode pattern is transferred to the photoresist film 132 by development with an alkali solution, as shown in FIG. 21 (b). The Al layer 131 on the substrate 130 is then etched with an Al etching solution, leaving only a portion of the Al layer 131 covered with the photoresist film 132 and corresponding to the wiring electrode pattern, as shown in FIG. 21 (c). In this process, a general etching solution such as a mixture solution containing $H_3PO_4$, $HNO_3$ and $CH_3COOH$ or the like is used as the Al etching solution. When the Al etching solution is heated to 45° C. the etching rate of the Al layer 131 is about 4500 to 5000 Å per minute, and the etching rate of the baked photoresist film 132 is substantially zero.

Figure 21D:
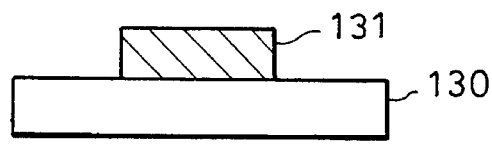
Figure 22:
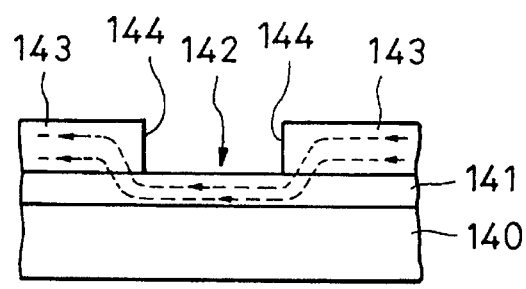
FIG. 22 is a longitudinal sectional view showing an electrothermal conversion device formed by the wiring electrode forming process shown in FIG. 21.
Figure 23:
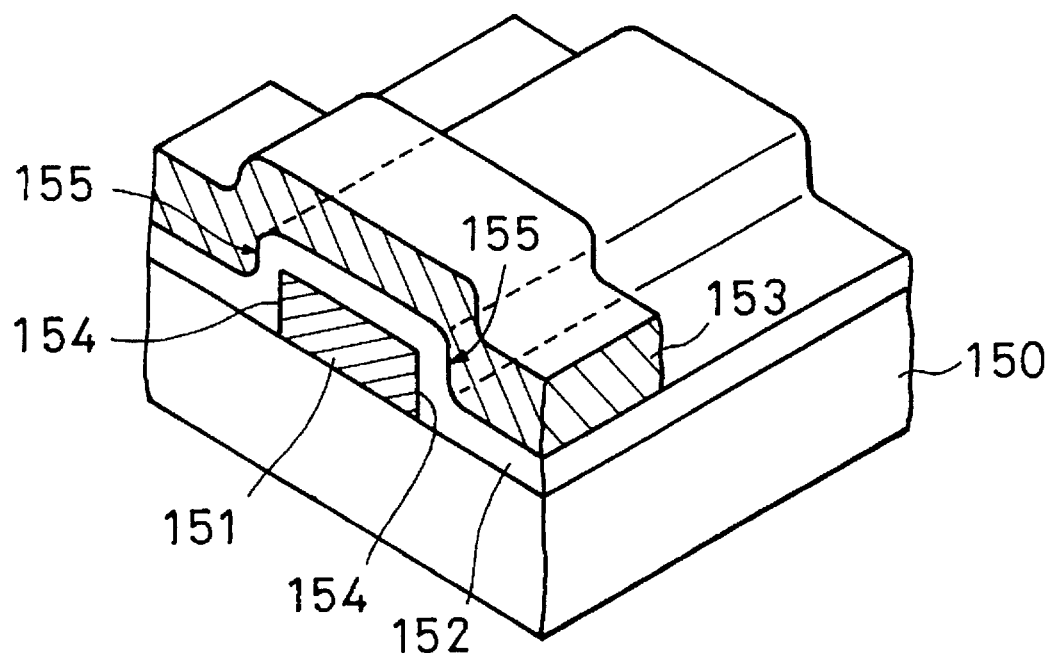
FIG. 23 is a partially broken-out schematic perspective view illustrating a step coverage in the electrothermal conversion device formed by the wiring electrode forming process shown in FIG. 21.

In the final stage, the remaining photoresist film 132 is removed from the substrate 130, as shown in FIG. 21(d). After the photoresist film 132 is removed, the edge portion of the Al layer 131 has a surface intersecting the surface of the substrate 130 at substantially right angles. The surface of the edge portion intersecting the surface of the substrate at right angles causes the following problems in recent times as great importance has been attached to a multilayer functional device having higher integration:

(1) For example, an electrothermal converter which generates thermal energy in a high-electrical resistance heat generator when a current is passed through the heat generator, as shown in FIG. 22. In FIG. 22, reference numeral 140 denotes a substrate; reference numeral 141, a heat generating resistance layer; reference numeral 142, a heat generating portion formed in the heat generating resistance layer 141; reference numeral 143, an Al wiring electrode; and reference numeral 144, the edge portion of the wiring electrode 143. The current flow from the wiring electrode 143 to the heat generating portion 142 is concentrated in a portion below the edge portion 144, i.e., on the side of the heat generating portion 142, as shown in FIG. 22. This is explained with reference to experimental results. The current density of the portion below the edge portion 144 reaches $8.2 \times 10^7$ A/cm², which is significantly higher than the current density of $1.7 \times 10^6$ A/cm² in the wiring electrode 143 and the current density of $1.03 \times 10^7$ A/cm² in the heat generating portion 142 of the heat generating resistance layer 141. As a result, the concentration of the current density in the portion below the edge portion 144 causes partial cutting of the heat generating resistance layer 141 and thus the danger of decreasing the life of the electrothermal converter.

(2) For example, a device comprising a substrate 150, a band-shaped first wiring electrode 151 made of Al and formed on the substrate 150, a protective film 152 formed on the first wiring electrode 151, and a second wiring electrode 153 crossing the first wiring electrode 151 at right angles in the lengthwise direction thereof and formed on the protective film 152. In this case, the step coverage of the protective film 152 at the edge portions 154 of the first wiring electrode 151 deteriorates, thereby causing danger of electrical insulating property between the first wiring electrode 151 and the second wiring electrode 153.

The present invention thus employs the method below for producing the electrothermal converter.

An electrode forming method which can be used for forming the electrode of the present invention shown in FIG. 10 is described below with reference to FIG. 24.

Some of the components of the semiconductor device shown in FIG. 24 are the same as those of the semiconductor device shown in FIG. 21. The same components are denoted by the same reference numerals, and are not described below.

Figure 24A:
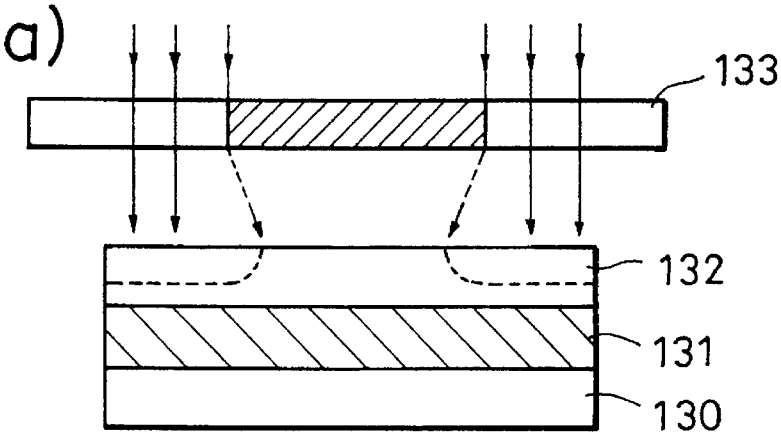
FIG. 24 is a sectional view illustrating, in a time series manner, an example of an electrode forming process which can be applied for forming an electrode in the present invention.

As shown in FIG. 24(a), the Al layer 131 as a wiring electrode material is formed on the substrate 130, and the mask photoresist film 132 is then coated on the Al layer 131. Regions of the photoresist film 132 other than the wiring electrode pattern are then exposed through a glass photomask 133 placed at a distance of about 40 to 100 μm from the photoresist film 132 (extended interval exposure). During this exposure, diffracted light is generated in a portion below the pattern edge of the glass photomask 133. The use of the diffracted light causes the exposure of a region of the photoresist 132 wider than the transmitting pattern of the glass photomask 133. It is thought that the exposure energy on the extended interval exposure is about ½ of the threshold energy value ($E_{th}$) of light passing through the photoresist film 132 during development.

Exposure of the photoresist film 132 faithful to the transmitting pattern of the glass photomask 133 is then made where the glass photomask 133 is brought into contact with or near the photoresist film 132 at a distance of 0 to 12 μm (proximity exposure). The exposure energy ($E_{EXPO}$) of the proximity exposure is about ½ to equivalent to the above threshold energy value ($E_{th}$).

Figure 24B:
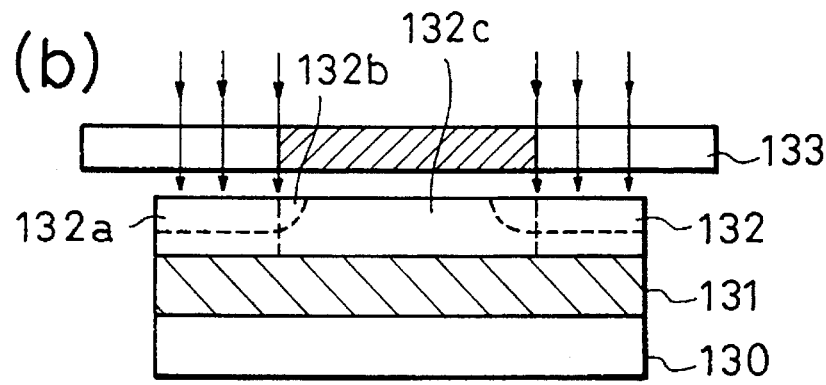

The two-stage exposure causes the photoresist film 132 to be clearly divided into three regions, as shown in FIG. 24(b). A first region is a region 132a which is exposed to energy of $E_{th}$ or more ($E_{EXPO} > E_{th}$), a second region is a region 132b exposed to energy of 0 to ½ of $E_{th}$ ($0 < E_{EXPO} < ½E_{th}$), and a third region is a region 132c which is not exposed to energy ($E_{EXPO} = 0$).

Figure 24C:
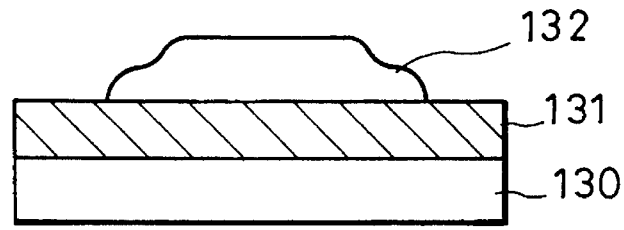
Figure 24D:
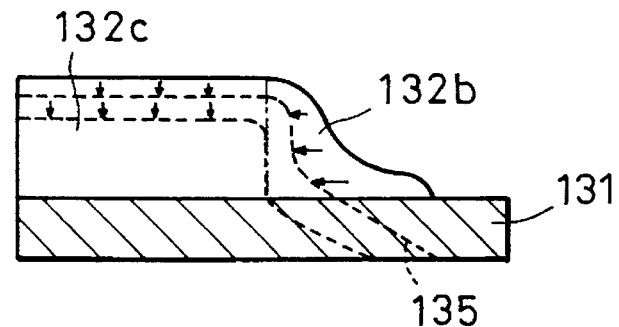

After the glass photomask 133 is separated from the photoresist film 132, the photoresist is subjected to development using an alkali solution, for example, TMAH (tetramethylammonium hydroxide), at room temperature to form a sloped or tapered pattern edge portion of the photoresist 132, as shown in FIG. 24(c). In the development stage, the first region 132a of the photoresist 132 is completely dissolved in the alkali solution, the surface of the second region 132b is partially dissolved, and the third region 132c remains undissolved and holds the original shape to form a tapered pattern edge portion.

The Al layer 131 is then wet-etched using as a mask material the photoresist film 132 having the tapered pattern edge. In this wet etching, the alkali solution used in the development is preferably used.

Although the etching rate of the Al layer made of an amphoteric Al metal with the TMAH etching solution is proportional to the temperature of the etching solution, the etching rate of the photoresist is inversely proportional to the temperature of the etching solution. Accordingly, the temperature of the TMAH solution is appropriately adjusted so that the photoresist 132 and the Al layer 131 can be simultaneously etched to form the pattern edge portion having a tapered sectional form in the Al layer 131. The photoresist 132 and the Al layer 131 are simultaneously treated with the TMAH at a temperature appropriately adjusted so that etching of the Al layer 131 and the photoresist 132 proceeds simultaneously. The etching of the photoresist 132 does not proceed at the same rate over the whole photoresist film 132, as shown by arrows in FIG. 24(d).

The etching rate of the third region 132c which is not exposed to exposure energy is reasonably lower than that of the second region 132b which is slightly exposed to exposure energy. Although etching of the second region 132b of the photoresist film 132 proceeds at a relative high speed, the etching rate is abruptly decreased as etching proceeds from the second region 132b to the third region 132c. The etching of the third region 132c is stopped relative to the other portions. The pattern edge portion of the Al layer 131 below a portion of the photoresist 132 where the second region 132 has been present is formed into a tapered shape with good controllability by etching which proceeds as described above.

In a functional device such as an ink jet recording head or a thermal head, which has a heat generator comprising wiring and electrodes formed by the Al layer with the above tapered pattern edge, the presence of the tapered pattern edge in the Al layer prevents the current flow from the Al layer to the heat generator from being concentrated in a portion below the edge portion. This prevents the partial cutting of the heat generating resistor, as is caused in a conventional device due to the concentration of current density, thereby, increasing the life of the device. The functional device can thus be improved in durability and performance.

As described above, the embodiment of the present invention enables the mitigation of field concentration in a MOS transistor and an increase in voltage resistance thereof.

The present invention prevents the occurrence of latch up in a short-circuit pn-type element isolation structure.

The present invention also prevents the occurrence of bird's beaks in a buried type element isolation structure.

Further, the present invention inhibits concentration of the current density in a portion below the edge portion of the metal layer in an electrothermal conversion device, and thus prevents partial cutting of the heat generating resistor, thereby increasing the life of the device.

Other embodiments of the present invention are described below with reference to the drawings.

Figure 25:
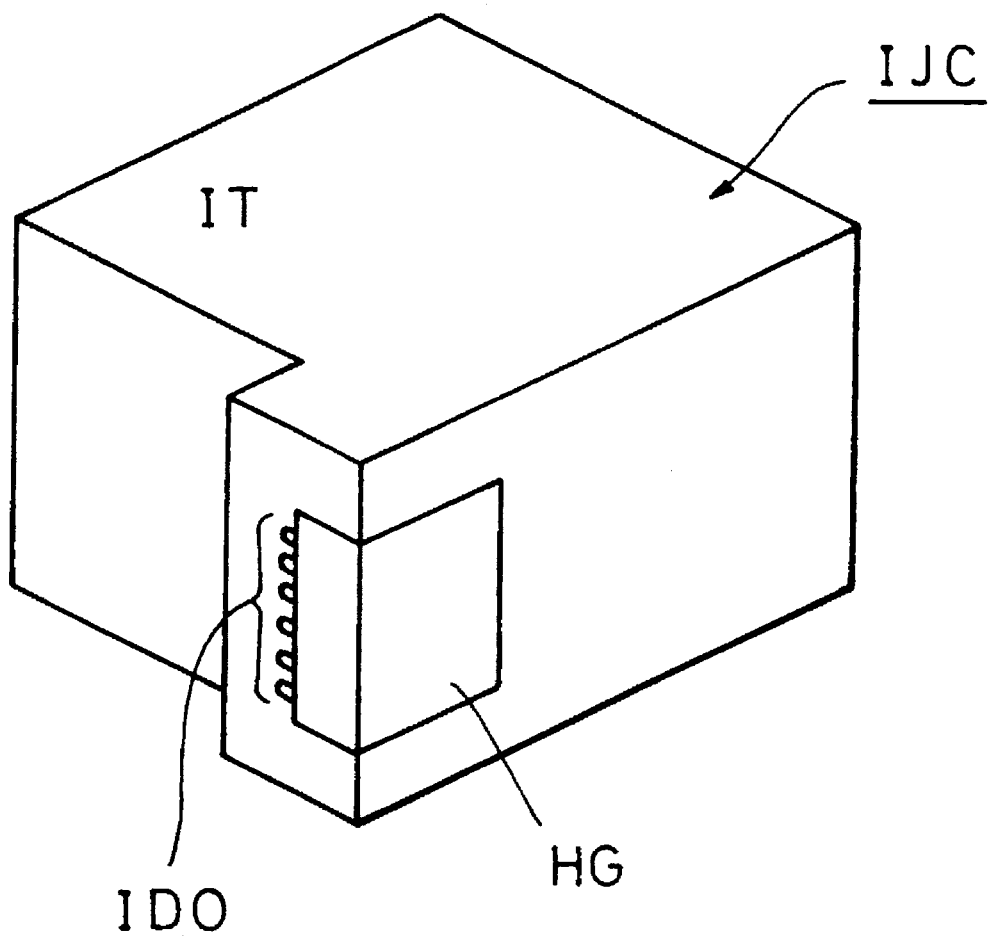
FIG. 25 is a schematic drawing showing an ink jet head to which the present invention is applied.

FIGS. 25 and 26 are drawings illustrating a preferred heat generator HG, an ink jet head IJC, an ink jet recording device body IJRA and a carriage HC, and the relations among them in which the present invention is performed or applied. The configuration of each unit is described below with reference to the drawings.

The ink jet head IJC in accordance with an embodiment is a cartridge type having an ink tank IT integrally formed therein, and has a shape with a tip portion slightly projecting from the front side of the ink tank IT. The ink jet head IJC is fixed and supported by positioning means and electrical contact of the carriage HC (FIG. 26) mounted on the ink jet recording device body IJRA so as to be detachable from the carriage HC.

1) Construction of Ink Jet Head IJC

The ink jet head IJC is an ink jet type head using thermal energy which records information using an electrothermal converter for generating thermal energy for producing membrane boiling in ink in accordance with an electrical signal.

The semiconductor device HG shown in FIG. 10 is attached to a body for forming the ink tank IT and the ink discharge opening IDO, as shown in FIG. 25.

FIG. 26 is a perspective view of the ink jet recording device IJRA to which the present invention is applied. The carriage HC which engages with a helical groove 5004 of a lead screw 5005 rotated in interlock with the normal and reverse rotation of a driving motor 5013 through driving force transmission gears 5011 and 5009 has a pin (not shown) and is reciprocated in the directions of arrows a and b. Reference numeral 5002 denotes a paper presser plate for pressing paper on a platen 5000 in the direction of movement of the carriage. Reference numerals 5007 and 5008 each denote a photocoupler as home position detection means for switching the rotation direction of the motor 5013 when detecting the presence of the lever 5006 of the carriage. Reference numeral 5016 denotes a member for supporting a cap member for capping the front side of the recording head, and reference numeral 5015 denotes suction means for applying suction to the cap so as to recover the recording head by suction through a cap opening 5023. Reference numeral 5017 denotes a cleaning blade, and reference numeral 5019 denotes a member for permitting forward and backward movement of the blade, these members 5017 and 5019 being supported by a body supporting plate 5018. A known cleaning blade having another form can, of course, be used as the blade in the present invention. Reference numeral 5021 denotes a lever for starting suction for recovering the head, which is moved with the movement of a cam 5020 engaged with the carriage so that the transmission of the driving force generated from the driving motor is controlled by known transmission means for switching a clutch or the like.

The recording device is configured so that the capping, cleaning and suction recovery are desirably performed at corresponding positions when the carriage is moved to the home position region by the lead screw 5005. However, any desired arrangement can be applied so far as a desired operation is performed with known timing. The above components of the device are excellent from the individual point of view and the composite point of view. The above configuration is a preferred example for the present invention.

While the present invention has been described with respect to what is presently considered to be the preferred embodiments, it is to be understood that the invention is not limited to the disclosed embodiments. The present invention is intended to cover the various modifications and equivalent arrangements included within the spirit and scope of the appended claims.

What is claimed is:

1. A semiconductor device comprising:

a plurality of transistors, wherein each transistor comprises:

a first semiconductor region of a first conduction type, including a first main electrode region;

a second semiconductor region of a second conduction type, including a channel region, said second semiconductor region being disposed in said first semiconductor region and in contact therewith, said channel region being in contact with a portion of said first main electrode region;

a second main electrode region of the first conducting type disposed in said second semiconductor region and in contact with said channel region;

a gate insulating film disposed on said channel region;

a gate electrode disposed on said gate insulting film and in alignment with said channel region; wherein said portion of said first main electrode region which contacts said channel region is a high-resistance region.

2. A semiconductor device according to Claim 1, wherein said second main electrode region is connected to an electrothermal converter.

3. A semiconductor device according to claim 2, wherein a process of forming an electrode of said electrothermal converter comprises the first step of exposing to exposure energy a photoresist provided on a metal layer as a wiring electrode at a distance of 40 to 100 μm between said photoresist and a photomask disposed thereon and having a-wiring electrode pattern, and the second step of exposing to exposure energy said photoresist at a distance of 0 to 14 μm between said photoresist and said photomask.

4. A semiconductor device according to claim 3, wherein said process of forming an electrode of said electrothermal converter further comprises the development step of developing said photoresist after said second exposure step, and the etching step of etching said metal layer while contracting at least the end of said photoresist with an alkali solution during etching of said metal layer using said photoresist as a mask.

5. A semiconductor device according to claim 2, wherein said semiconductor device forms a thermal head.

6. A semiconductor device according to claim 2, wherein said semiconductor device forms an ink jet head.

7. A semiconductor device according to claim 1, wherein said transistors are provided in a matrix of dimensions N×M and wherein said transistors are divided into groups corresponding to N, wherein a gate is common to the transistors in each group.

8. A semiconductor device according to claim 1, wherein said transistors are provided in a matrix of dimensions N×M and wherein said transistors are divided into groups corresponding to N, wherein an electrothermal converter is connected to each of said transistors.

9. A semiconductor device according to claim 1, wherein said first main electrode region serves as a drain, and said second main electrode region serves as a source.

10. A semiconductor device according to claim 1, wherein said first semiconductor region comprises a buried layer, said high-resistance region disposed on said buried layer, and a low-resistance region adjacent to said high-resistance region.

11. A semiconductor device according to claim 1, wherein a plurality of said second main electrode regions are disposed in said second semiconductor region, and contact a common electrode.

12. A semiconductor device according to claim 4, wherein said second main electrode regions are connected to said second semiconductor region by said common electrode.

13. A semiconductor device according to claim 1, further comprising a plurality of element isolation regions arranged so that each of said transistors is electrically isolated.

14. A semiconductor device according to claim 13, wherein each of said element isolation regions has a first isolation region comprising a p-type semiconductor, and a second isolation region contained in said first isolation region comprising an n-type semiconductor, both isolation regions being in contact with a metal which forms a short circuit between said first and said second isolation regions.

15. A semiconductor device according to claim 13, wherein each of said element isolation regions comprises an insulating portion filled in a recessed portion.

16. A semiconductor device according to claim 15, wherein each of said element isolation regions is formed by a method of filling an insulator comprising a first step of coating the bottom and side of an opening with said insulator, and a second step of filling said opening with said insulator.

17. A semiconductor device according to claim 16, wherein the insulator filled in said first step is different from that filled in said second step.

18. A semiconductor device according to claim 17, wherein said insulator filled in said opening is levelled to the same height as that of the surface of said semiconductor substrate.

19. A semiconductor device according to claim 1, has a surface which is flattened.

20. An image forming apparatus comprising a semiconductor device, said semiconductor device comprising:

a plurality of transistors, wherein each transistor comprises:

a first semiconductor region of a first conducting type, including a first main electrode region;

a second semiconductor region of a second conduction type, including a channel region, said second semiconductor region being disposed in said first semiconductor region, and in contact therewith, said channel region being in contact with a portion of said first main electrode region;

a second main electrode region of the first conducting type disposed in said second semiconductor region and in contact with said channel region, and connected to an electrothermal converter;

a gate insulating film disposed on said channel region;

a gate electrode disposed on said gate insulating film and in alignment with said channel region; said portion of said first main electrode region which contacts said channel region is a high-resistance region; and wherein said semiconductor device forms a thermal head.

21. An image forming apparatus comprising a semiconductor device according to claim 20, further comprising said semiconductor device as a head for discharging ink by employing thermal energy.

22. An image forming apparatus according to claim 20, further comprising a conveyance means for conveying a medium.

23. An image forming apparatus according to claim 20, further comprising means for arranging said head opposite to said medium.

* * * * *

UNITED STATES PATENT AND TRADEMARK OFFICE
CERTIFICATE OF CORRECTION

PATENT NO. : 5,517,224
DATED : May 14, 1996
INVENTOR(S) : SHUNICHI KAIZU ET AL.          Page 1 of 3

It is certified that error appears in the above-identified patent and that said Letters Patent is hereby corrected as shown below:

AT [57] ABSTRACT

Line 4, "second" should read --a second--.

COLUMN 1

Line 32, "8 0" should read --8--.

COLUMN 2

Line 11, "Tr11," should read --Tr11.--.
Line 27, "Circuit" should read --circuit--.
Line 41, "Of" shoudl read --of--.

COLUMN 3

Line 44, "ms" should read --is--.

COLUMN 5

Line 42, "aluminum." should read --aluminum--.

COLUMN 6

Line 58, "5" should be deleted.

COLUMN 7

Line 36, "Comb8" should read --Com8--.
Line 52, "FIG. 8" should read --FIG. 8 is--.

UNITED STATES PATENT AND TRADEMARK OFFICE
CERTIFICATE OF CORRECTION

PATENT NO. : 5,517,224
DATED : May 14, 1996
INVENTOR(S) : SHUNICHI KAIZU ET AL.

It is certified that error appears in the above-identified patent and that said Letters Patent is hereby corrected as shown below:

COLUMN 8

Line 3, "Co2," should read --Com2,--.

COLUMN 10

Line 6, "a n+" should read --an $n^+$--.

COLUMN 12

Line 4, "formed," should read --be formed,--.
Line 39, "an" should read --a--.

COLUMN 15

Line 2, "region 132" should read --region 132b--.
Line 14, "thereby," should read --thereby--.

COLUMN 16

Line 47, "conducting" should read --conduction--.
Line 56, "Claim 1," should read --claim 1,--.
Line 65, "a-wiring" should read --a wiring--.

COLUMN 17

Line 35, "claim 4," should read --claim 11,--.

UNITED STATES PATENT AND TRADEMARK OFFICE
CERTIFICATE OF CORRECTION

PATENT NO. : 5,517,224
DATED      : May 14, 1996
INVENTOR(S): SHUNICHI KAIZU ET AL.

It is certified that error appears in the above-identified patent and that said Letters Patent is hereby corrected as shown below:

COLUMN 18

Line 20, "conducting" should read --conduction--.
Line 28, "conducting" should read --conduction--.
Line 34, "region; said" should read --region; ¶ said--.

Signed and Sealed this

Twenty-second Day of October, 1996

Attest:

BRUCE LEHMAN

Attesting Officer

Commissioner of Patents and Trademarks